United States Patent
Seibert et al.

(10) Patent No.: US 8,843,181 B2
(45) Date of Patent: Sep. 23, 2014

(54) SENSOR USES IN COMMUNICATION SYSTEMS

(75) Inventors: Cristina A. Seibert, Mountain View, CA (US); Douglas Neal Rowitch, Del Mar, CA (US); Parvathanathan Subrahmanya, Sunnyvale, CA (US); Leonid Sheynblat, Hillsborough, CA (US)

(73) Assignee: QUALCOMM Incorporated, San Diego, CA (US)

( * ) Notice: Subject to any disclaimer, the term of this patent is extended or adjusted under 35 U.S.C. 154(b) by 953 days.

(21) Appl. No.: 12/473,190

(22) Filed: May 27, 2009

(65) Prior Publication Data
US 2010/0304761 A1 Dec. 2, 2010

(51) Int. Cl.
H04M 1/00 (2006.01)
H04W 52/02 (2009.01)
H03G 3/30 (2006.01)
H04B 1/7085 (2011.01)
H04B 1/7117 (2011.01)
H04L 25/03 (2006.01)
H04W 48/16 (2009.01)

(52) U.S. Cl.
CPC ......... *H04W 52/0254* (2013.01); *H03G 3/3078* (2013.01); H04L 2025/03566 (2013.01); *H04L 25/03019* (2013.01); Y02B 60/50 (2013.01); H04W 48/16 (2013.01); *H04B 1/7085* (2013.01); *H04B 1/7117* (2013.01)
USPC .... 455/574; 455/434; 455/456.4; 340/426.22

(58) Field of Classification Search
CPC .................................................. H04W 52/0254
USPC .................. 455/456.4, 574, 434; 340/426.22
See application file for complete search history.

(56) References Cited

U.S. PATENT DOCUMENTS

| 4,841,329 A | 6/1989 | Kasamura et al. |
| 6,208,861 B1 | 3/2001 | Suzuki |

(Continued)

FOREIGN PATENT DOCUMENTS

| EP | 0903951 | 3/1999 |
| EP | 1146653 A2 | 10/2001 |

(Continued)

OTHER PUBLICATIONS

Buchacher C., et al., "A hybrid equalizer/Rake receiver for the Wideband CDMA Downlink in large delay spread channels", Copernicus Publications on behalf of the URSI Landesausschuss in der Bundesrepublik Deutschland e.V. 2008, XP002617795, Retrieved from the Internet: URL:http://www.adv-radio-sci.net/6/107/200 8/ars-6-107-2008.pdf.

(Continued)

*Primary Examiner* — Hsin-Chun Liao
(74) *Attorney, Agent, or Firm* — Shyam K. Parekh; Michael Johnson

(57) ABSTRACT

Methods and apparatus are directed to mobile devices utilizing motion and/or position sensors for improving operating performance and/or power efficiency. In one example, a method for reducing power consumption in a mobile device includes receiving movement information, establishing movement data based on the movement information, determining if the mobile device is stationary using the movement data; and reducing the frequency of searching for a base station when the mobile device is stationary. In another example, a mobile device which reduces power consumption based upon movement data includes an RF front end, a receiver coupled to the RF front end, a data demodulator coupled to the receiver, a searcher, coupled to the RF front end and the receiver, which searches for base stations, and a processing unit coupled to the searcher, wherein the processing unit controls the searcher based upon the stationarity of the mobile device.

8 Claims, 14 Drawing Sheets

(56) References Cited

U.S. PATENT DOCUMENTS

| | | | |
|---|---|---|---|
| 6,714,983 | B1 | 3/2004 | Koenck et al. |
| 7,149,518 | B2 * | 12/2006 | Attimont et al. .............. 455/434 |
| 7,257,417 | B1 * | 8/2007 | Krasner .................... 455/456.3 |
| 2005/0134503 | A1 * | 6/2005 | Colley et al. ............. 342/357.09 |
| 2005/0243899 | A1 | 11/2005 | Bilgic et al. |
| 2006/0098766 | A1 | 5/2006 | Pietraski et al. |
| 2007/0071070 | A1 | 3/2007 | Dominique et al. |
| 2007/0176760 | A1 * | 8/2007 | Reeves et al. ............ 340/426.22 |
| 2008/0102774 | A1 | 5/2008 | Fratti et al. |
| 2009/0110049 | A1 | 4/2009 | Luschi et al. |

FOREIGN PATENT DOCUMENTS

| | | | |
|---|---|---|---|
| EP | 1261144 | A1 | 11/2002 |
| EP | 1887748 | A2 | 2/2008 |
| GB | 2264837 | A | 9/1993 |
| GB | 2305825 | A | 4/1997 |
| JP | 5232210 | A | 9/1993 |
| JP | 9098465 | A | 4/1997 |
| JP | 11098071 | A | 4/1999 |
| JP | 2003207556 | A | 7/2003 |
| WO | WO2004021585 | | 3/2004 |
| WO | WO2004023672 | | 3/2004 |
| WO | WO2008017908 | A1 | 2/2008 |

OTHER PUBLICATIONS

International Search Report and Written Opinion—PCT/US2010/036214, International Search Authority—European Patent Office—Feb. 25, 2011.

U.S. Appl. No. 11/958,257, filed Dec. 17, 2007 with the USPTO, Titled, "Method and Apparatus for Establishing a Wireless Network Signal Acquisition Rate", Inventor Douglas Neal Rowitch, Assignee QUALCOMM, Incorporated, Customer No. 23696.

Taiwan Search Report—TW099117052—TIPO—May 20, 2013.

Taiwan Search Report—TW099117052—TIPO—Dec. 7, 2013.

* cited by examiner

SENSOR USES IN COMMUNICATION SYSTEMS

FIELD OF DISCLOSURE

Aspects of this disclosure generally relate to wireless communication systems, and more specifically, to motion sensing methods and apparatuses for use with and/or by a mobile device.

BACKGROUND

Mobile communications networks are in the process of offering increasingly sophisticated capabilities associated with the motion and/or position location sensing of a mobile device. New software applications, such as, for example, those related to personal productivity, collaborative communications, social networking, and/or data acquisition, may utilize motion and/or position sensors to provide new features and services to consumers. Moreover, some regulatory requirements of various jurisdictions may require a network operator to report the location of a mobile device when the mobile device places a call to an emergency service, such as a 911 call in the United States.

Such motion and/or position capability has conventionally been provided using subsystems within a mobile device which utilize Satellite Positioning Systems (SPS) for determining absolute positioning. Additionally, with the increasing proliferation of micro electro-mechanical systems (MEMS), small, on-board sensors may be used to provide relative position, velocity, acceleration and/or orientation information.

Mobile communication networks typically overcome a wide variety of technical challenges in order to operate effectively. Many solutions addressing such technical issues can be improved by applying information regarding the position and/or motion of a mobile device while operating in the network. Existing techniques for base station acquisition, mobile receiver design and power conservation, among other things, could be improved in order to meet ever-increasing consumer expectations.

Accordingly, it may be desirable to utilize sensors, which can provide motion and/or position information, to improve the performance and/or power consumption characteristics of a mobile device.

SUMMARY

Exemplary embodiments of the invention are directed to systems and methods for utilizing sensors providing motion and/or position information in mobile devices.

In one embodiment, a method for reducing power consumption in a mobile device is provided. The method may include receiving movement information and establishing movement data based on the movement information. The method may further include determining if the mobile device is stationary using the movement data, and reducing the frequency of searching for a base station when the mobile device is stationary.

In another embodiment, a mobile device which reduces power consumption based upon movement data is presented. The mobile device may include an RF front end, a receiver coupled to the RF front end and a data demodulator coupled to the receiver. The mobile device may further include a searcher, coupled to the RF front end and the receiver, which searches for base stations, and a processing unit coupled to the searcher, wherein the processing unit controls the searcher based upon the stationarity of the mobile device.

In yet another embodiment, a method for improving the responsiveness of an automatic gain control (AGC) in a mobile device is presented. The method may include receiving movement information and establishing movement data based on the movement information. The method may further include determining AGC parameters using the movement data, and modifying a responsiveness of the AGC based on the AGC control parameters.

In another embodiment an apparatus which improves the responsiveness of an automatic gain control (AGC) in a mobile device is provided. The apparatus may include an RF front end, a receiver coupled to the RF front end. The apparatus may further include a data demodulator coupled to the receiver, an AGC, coupled to the RF front end which controls the gain of a signal provided to the receiver, and a processing unit coupled to the AGC, wherein the processing unit controls the responsiveness of the AGC based upon the velocity of the mobile device.

In another embodiment a method for improving the responsiveness of an equalizer receiver in a mobile device is presented. The method may include receiving movement information, and establishing movement data based on the movement information. The method may further include determining filter parameters using the movement data, and modifying a filter in the equalizer receiver based on the filter parameters.

In another embodiment, an apparatus which improves the responsiveness of an equalizer receiver in a mobile device is presented. The apparatus may include an RF front end, and an equalizer receiver coupled to the RF front end. The apparatus may further include an data demodulator coupled to the equalizer receiver, and a processing unit coupled to the equalizer receiver, where the processing unit controls the responsiveness of the equalizer receiver based upon the velocity of the mobile device.

In yet another embodiment a method for improving the responsiveness of a pilot filter in a mobile device is provided. The method may include receiving movement information, and establishing movement data based on the movement information. The method may further include determining a pilot filter based upon the movement data, and selecting the determined pilot filter for extracting a pilot signal from a received signal.

In another embodiment an apparatus which improves the responsiveness of a pilot filter in a mobile device is presented. The apparatus may include a pilot filter which further includes a plurality of filters, and a switch operably coupled to the plurality of filters. The apparatus may further include a processing unit coupled to the switch, where the processing unit commands the switch to select one of the plurality of filters based upon the speed of the mobile device.

In yet another embodiment a method for improving responsiveness of a RAKE receiver in a mobile device is provided. The method may include receiving movement information, and establishing movement data based on the movement information. The method may further include determining searcher adjustment from the movement data, and providing searcher adjustment values to the searcher for improving finger tracking performance in the RAKE receiver.

In another embodiment an apparatus which improves responsiveness of a RAKE receiver in a mobile device is provided. The apparatus may include a RAKE receiver, further including a plurality of fingers, a finger control unit operably coupled to the plurality of fingers, and a combiner operably coupled to the plurality of fingers. The apparatus may further include a searcher unit operably coupled to the finger control unit, and a processing unit coupled to the searcher unit, wherein the processing unit controls the searcher unit based upon the velocity of the mobile device.

In yet another embodiment a method for improving performance of a receiver in a mobile device is provided. The method may include receiving movement information, and establishing movement data based on the movement information. The method may further include determining a command based upon the movement data, and establishing the usage of a RAKE receiver and an equalizer receiver based upon the determined command.

In another embodiment an apparatus which improves the responsiveness of a receiver in a mobile device is provided. The apparatus may include a RAKE receiver, an equalizer receiver, and a selector/combiner unit coupled to the RAKE receiver and the equalizer receiver. The apparatus may further include a processing unit coupled to the selector/combiner unit, where the processing unit controls the usage of the RAKE receiver and the equalizer receiver based upon the velocity of the mobile device.

In another embodiment, a method for altering the response time of a filter is provided. The method includes receiving movement information, establishing movement data based on the movement information, and adjusting an IIR filter coefficient based upon the movement data. The method further includes weighting historical data more heavily when the movement data indicates the speed of a mobile device is low, and weighting historical data less heavily when the movement data indicates the speed of the mobile device is high.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
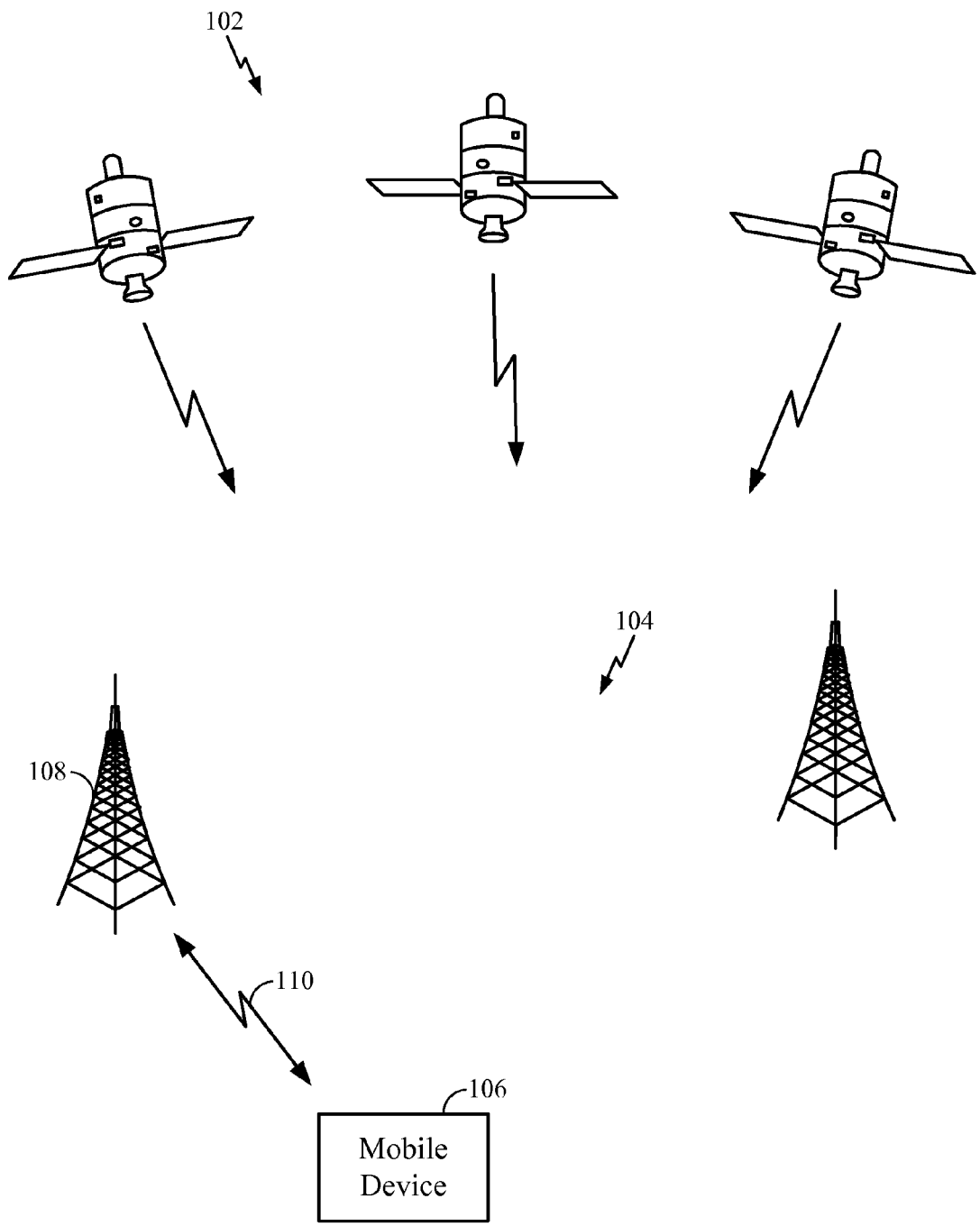
FIG. 1 is a block diagram illustrating an exemplary system where a mobile device works in conjunction with a wireless communications system and a satellite positioning system.

FIG. 1 is a block diagram illustrating an exemplary system that includes a mobile device 106 configurable to communicate with at least one wireless communication network 104. As shown, wireless network 104 may, for example, include one or more base stations or other like devices capable of communicating with mobile device 106 through a wireless signal. As shown in this example, mobile device 106 may also be configurable to receive signals from a satellite positioning system (SPS) 102.

In the example of FIG. 1, base station 108 is shown as being within wireless communication network 104. It should be understood that wireless communication network 104 may include additional base stations or other resources, including mobile device 106 in certain implementations. While base station 108 may actually be movable or otherwise capable of being relocated, for illustration purposes it will be assumed that base station 108 is essentially arranged in a fixed position.

To the contrary, the position of mobile device 106, for example, with respect to base station 108 may change as it is moved about. It is therefore possible that, at times, mobile device 106 will be in a position where for some reason signal 110 from base station 108 may not be acquired by mobile device 106. For example, mobile device 106 may move out of the coverage area of base station 108, or mobile device 106 may be located in a position wherein signal 110 is blocked or otherwise interfered with in some manner. Consequently, there will be times when mobile device 106 needs to acquire or re-acquire signal 110. Depending on the situation, mobile device 106 may perform a plurality of signal acquisition attempts before it successfully acquires signal 110.

As used herein, a portable wireless device refers to any portable or movable device or machine that is configurable to acquire wireless signals transmitted from, and transmit wireless signals to, one or more wireless communication devices or networks. In FIG. 1, mobile device 106 is representative of such a portable wireless device. Thus, by way of example but not limitation, mobile device 106 may include a radio device, a cellular telephone device, a computing device, a personal communication system (PCS) device, or other like movable wireless communication equipped device, appliance, or machine.

The term "acquire" as used herein with regard to a wireless signal and a portable wireless device, refers to the portable wireless device having obtained sufficient information from a wireless signal to enable processing of the received wireless signal to obtain data transmitted therein. Such information may include, for example, information relating to a carrier frequency, an RF phase, a code, a code-phase, timing, and/or Doppler shift, just to name a few examples. Upon successfully acquiring a wireless signal from a wireless communication network, a portable wireless device may communicate further with the wireless communication network. The actual wireless signal acquisition technique that may be implemented by the portable wireless device will depend on the wireless signaling scheme associated with the wireless communication network. Such wireless signal acquisition techniques are well known and beyond the scope of the present description.

The term "stationarity" as used herein refers to the degree to which a mobile device remains unmoving with respect to a fixed reference. Accordingly, the stationarity of a mobile device is maintained when the mobile device is unmoving. However, stationarity may also be maintained when the speed of the mobile device is below a threshold, and the position of the mobile device is confined within the range of a single base station.

As described in greater detail below, the various aspects of the methods and apparatuses presented herein are not limited to any particular wireless signal acquisition technique or communication scheme.

As used herein, a wireless communication network refers to one or more devices configurable to transmit wireless signals to and receive wireless signals from a portable wireless device. In FIG. 1, wireless communication network 104 and base station 108, individually or combined, are representative of such a wireless communication network. Thus, by way of example but not limitation, wireless communication network 104 and base station 108, individually or combined, may include a wireless wide area network (WWAN), a wireless local area network (WLAN), a wireless personal area network (WPAN), and so on.

The term "network" and "system" are often used interchangeably. A WWAN may, for example, be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, and so on. A CDMA network may, for example, implement one or more radio access technologies (RATs) such as cdma2000, Wideband-CDMA (W-CDMA), an Ultra Mobile Broadband (UMB) network, and so on. Cdma2000 includes IS-95, IS-2000, and IS-856 standards. A TDMA network may, for example, implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. A WLAN may, for example, be an IEEE 802.11x network, and a WPAN may be a Bluetooth network, an IEEE 802.15x, or some other type of network. The techniques may also be used for any combination of WWAN, WLAN and/or WPAN.

As used herein, the term "Satellite Positioning System" may encompass a Global Positioning System (GPS), the European Galileo system, the Russian GLONASS system, NAVSTAR, GNSS, Beidou, QZNSS, a system that uses satellites from a combination of these systems, or any satellite positioning systems which may be developed in the future. Additionally, the term "Satellite Positioning System" may also include pseudolite positioning systems, or systems using a combination of pseudolites and satellites. Pseudolites may be defined as ground based transmitters that broadcast a Pseudo Noise (PN) code or other ranging code (similar to GPS or CDMA cellular signals modulated on a carrier signal, e.g., modulated on an L-band (or other frequency) carrier signal, which may be synchronized with GPS time. Each such transmitter may, for example, be assigned a unique PN code so as to permit identification by a remote receiver such as mobile device 106. Such a pseudolite system may be useful in situations where GPS signals from an orbiting satellite might be unavailable, such as in tunnels, mines, buildings, urban canyons or other enclosed areas.

Figure 2:
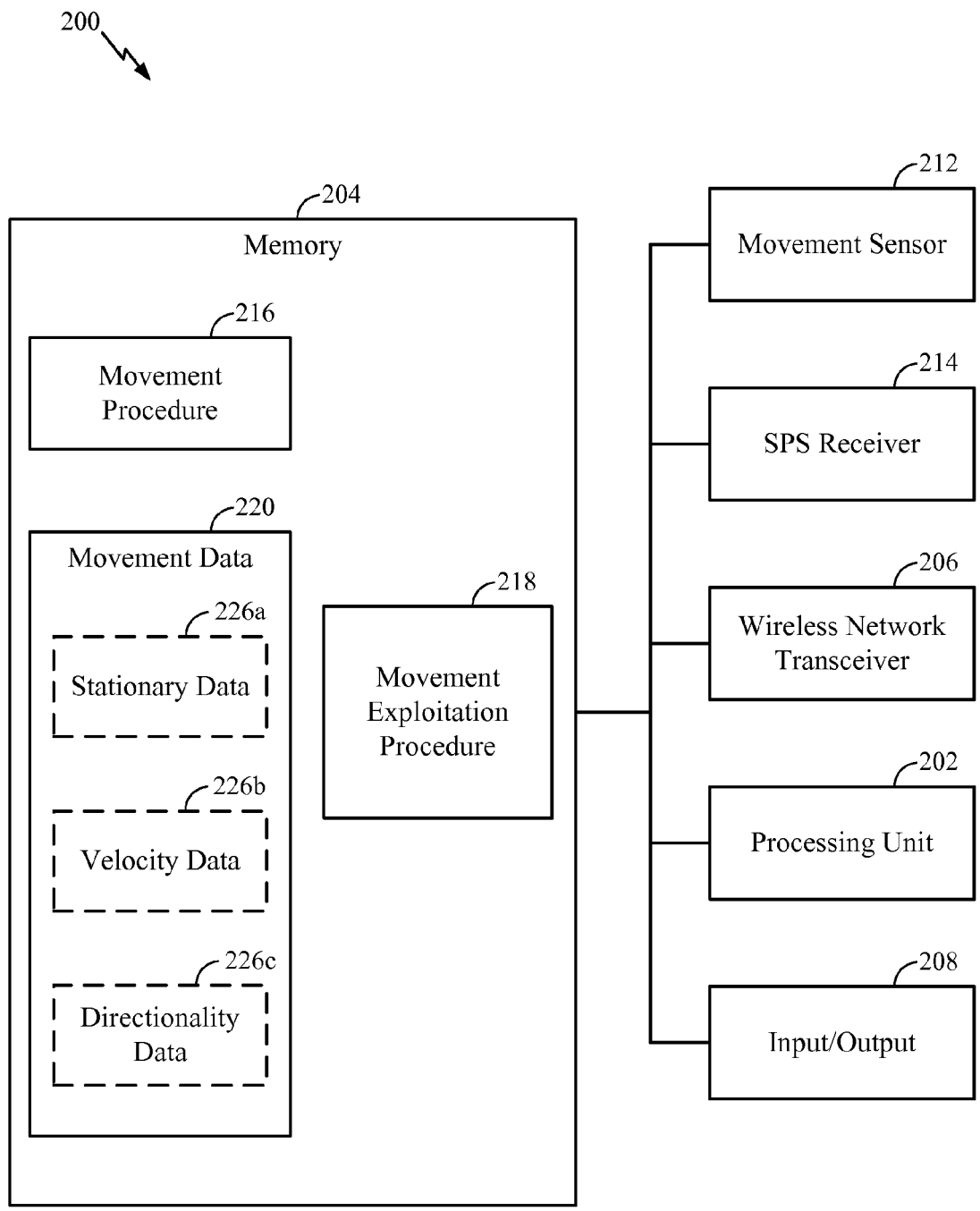
FIG. 2 is a functional a block diagram illustrating certain aspects of an exemplary mobile device.

FIG. 2 is functional a block diagram illustrating certain aspects of an exemplary mobile device 200. In this example, mobile device 200 may include a processing unit 202, a memory 204, a wireless network transceiver 206, an input/output interface 208, a power supply 210, a motion sensor 212, and an SPS receiver 214.

For the sake of simplicity, the various features and functions illustrated in the box diagram of FIG. 2 are connected together using a common bus which is meant to represent that these various features and functions are operatively coupled together. Those skilled in the art will recognize that other connections, mechanisms, features, functions, or the like, may be provided and adapted as necessary to operatively couple and configure an actual portable wireless device. Further, it is also recognized that one or more of the features or functions illustrated in the example of FIG. 2 may be further subdivided or two or more of the features or functions illustrated in FIG. 2 may be combined.

As illustrated here, within memory 204, mobile device 200 may include or otherwise provide a movement procedure 216 and a movement exploitation procedure 218. As illustrated here, within memory 204, mobile device 200 may further include movement data 220. In certain implementations, movement data 220 may, for example, include stationarity data 226a, velocity data 226b, and directionality data 226c. Movement exploitation procedure may include a variety of software modules which may further process derive information from the movement data, as will be described in more detail below.

All or part of movement data 220 may be derived from movement information supplied by movement sensor 212, and/or SPS receiver 214. The movement data 220 may be generated by processing movement information using processing unit 202 in accordance with movement procedure 216. In certain implementations, all or part of movement data 220 may also be provided by way of movement sensor 212 and/or SPS receiver 214 without further processing by processing unit 202. In some embodiments, the movement data 220 may be directly provide by the motion sensor 212 to the processing unit 202. For example, the stationarity data 226a may be directly provided in the form of a binary signal to the processing unit 202 to indicate the motion state of the mobile device 200. Moreover, processing unit 202 may, for example, be configurable to access movement data 220, and based at least in part thereon dynamically or from time to time exploit the motion data for utilization in other portions of mobile device 200A in accordance with movement exploitation procedure 218.

More specifically, processing unit 202, in accordance with movement procedure 216, may be configurable to receive or otherwise access movement information output by movement sensor 212 and/or SPS receiver 214. In certain implementations, such movement information may include digital movement data 220, shown in the example of FIG. 2 as being stored in memory 204. The movement data 220 may further include stationarity data 226a, which may provide data as to whether mobile device 200 is stationary. Stationarity data 226a may have the advantage of being produced with very little power consumption. Movement data 220 may also include velocity data 226b, which may provide direction and speed; however generation of this data may require more power to produce than stationarity data 226a. Movement data 220 may further include directionality data 226c, which may only provide direction of movement. Directionality data 226c may also require more power to generate than stationarity data 226a. Moreover, movement data may be combined with additional information, such as, for example, the position of the mobile device 200 and with one or more the base stations. This could be used to infer the speed and direction of motion of the mobile device with respect to the surrounding base stations.

In certain implementations, movement data 220 may, for example, be provided to memory 204 from movement sensor 212. Movement data 220 may, for example, be provided to memory 204 by processing unit 202 which may be configurable to directly receive corresponding movement information from movement sensor 212. For example, it is recognized that in certain implementations, processing unit 202 may need to convert or otherwise process the movement information output by movement sensor 212 to produce movement data 220.

Processing unit 202 in accordance with movement procedure 216 may be configurable to receive or otherwise access movement information output by SPS receiver 214. In certain implementations, such movement information may include digital movement data 220, shown in the example of FIG. 2 as being stored in memory 204. Movement data 220 may, for example, be provided to memory 204 from SPS receiver 214. Movement data 220 may, for example, be provided to memory 204 by processing unit 202 which may be configurable to receive corresponding movement information from SPS receiver 214 and output movement information. For example, it is recognized that in certain implementations, processing unit 202 may need to convert or otherwise process the movement information output by SPS receiver 214 to produce movement data 220.

In other embodiments, uncertainty data may be derived by processor 202 using data from movement sensor 212 and/or SPS receiver 214. Uncertainty data may represent a potential sensed change in position of the portable wireless device, e.g., based on a sensor reading, and/or one or more sensor readings accumulated at different times or over a period of time, etc.

Techniques for identifying, determining or otherwise estimating velocity and/or position uncertainty are well known and many are believed adaptable for use in mobile device 200.

By way of example but not limitation, if movement sensor 212 includes an accelerometer, gyroscope, or the like, which may provide movement information associated with detected acceleration of mobile device 200, then movement procedure 216 may configure processing unit 202 to integrate or otherwise process such movement information to establish at least an estimated corresponding velocity. In certain implementations, movement procedure 216 may configure processing unit 202 to process such movement information to establish an accumulated position uncertainty, or the like.

By way of additional example but not limitation, if movement sensor 212 includes a geomagnetic sensor, altimeter, or the like, which may output movement information associated with detected differences in the environment over time, then movement procedure 216 may configure processing unit 202 to interpret or otherwise process such movement information as needed to establish at least movement data 220, such as, e.g., an estimated corresponding velocity, an accumulated position uncertainty, or the like. For example, changes in compass readings over a period of time may be indicative of positional changes relating to movement based on which movement data 220 may be established. For example, changes in altitude readings may be indicative of positional changes relating to movement based on which movement data 220 may be established.

Further, within movement sensor 212, mobile device 200 may utilize an accelerometer (e.g., a MEMS device), a gyroscope, a geomagnetic sensor (e.g., a compass), an altimeter (e.g., a barometric pressure altimeter), and/or any other type of movement detection sensor. Moreover, movement sensor 212 may include a plurality of different types of devices and combine their outputs in order to provide motion information.

Movement exploitation procedure 218 may be executed by processor 202 in order to utilize the movement data 220 to improve the performance and/or power consumption characteristics of the mobile device 200. The movement exploitation procedure 218 may contain a number of software modules for performing a variety of functions related to processing and extracting information from the movement data. For example, the movement exploitation procedure 218 may further include a movement detection module, a stationarity detection module, a velocity detection module, a sensor data filter module, a signal conditioning module, a stationarity exploitation procedure, a velocity exploitation procedure, and/or a directionality exploitation procedure.

More specifically, in one example, the movement exploitation procedure may be used to improve the operation of the wireless network transceiver 206 by incorporating stationarity data 226a and/or velocity data 226b into its searcher module to save power. In another example, stationarity data 226a and/or velocity data 226b may be incorporated into the wireless network transceiver 206 to improve the performance of various receiver and/or signal processing functionalities. Presented below in subsequent figures and their corresponding descriptions are details regarding exemplary applications of movement exploitation procedure 218.

While movement procedure 216 and movement exploitation procedure 218 are illustrated in the example as being in memory 204, it is recognized that in certain implementations such procedures may be provided for or otherwise operatively arranged using other or additional mechanisms. For example, all or part of movement procedure 216 or movement exploitation procedure 218 may be provided in firmware. Additionally, while in this example movement procedure 216 and movement exploitation procedure 218 are illustrated as being separate features, it is recognized, for example, that such procedures may be combined together as one procedure or perhaps with other procedures, or otherwise further divided into a plurality of procedures.

Processing unit 202 may include any form of logic suitable for performing at least the techniques provided herein. For example, processing unit 202 may be operatively configurable based on instructions in memory 204 to selectively initiate one or more routines that exploit motion data for use in other portions of the mobile device. Wireless network transceiver 206 may, for example, be configurable to operatively couple mobile device 200 to at least on wireless communication network by acquiring such a wireless signal. Wireless network transceiver 206 may, for example, include communication circuitry operatively coupled to an antenna (not shown).

In certain implementations, input/output 208 may include one or more human input or output devices, a data port, a computer-readable media reader/adapter or port, or the like which allow for data or instructions to be provided to mobile device 200.

Presented below are various embodiments which can utilize motion and/or position information to improve the performance and/or power consumption characteristics of a mobile device.

Reducing Searcher Power Consumption

As provided herein, searchers within mobile devices may initiate signal acquisition by performing full searches associated with any signal source. In various embodiments, the searcher may be used by the mobile device to acquire the signal(s) provide by one or more GPS satellites. In other embodiments, the searcher may be used to acquire the communication signal provided by a base station. In other embodiments, the mobile device may use a single searcher, or a combination of searchers, to acquire a plurality of signals associated with different signal sources.

In one example, the mobile device may employ a searcher to perform full searches periodically in order to locate base stations. For example, in WCDMA systems, a full search may be performed every 30 seconds. In a full search, the receiver in mobile device 106 can look through the entire range of possible base stations, codes, time offsets, frequency offsets and other unknown parameters that may be associated with a received signal. The result of the full search would be to acquire the signal associated with an appropriate base station. However, when the phone is stationary or moving slowly, these updates may not be required, as the mobile device 106 could not have moved out of range of its current base station. Accordingly, performing these searches without regard to the velocity of the mobile device can consume power in an inefficient manner.

Figure 3:
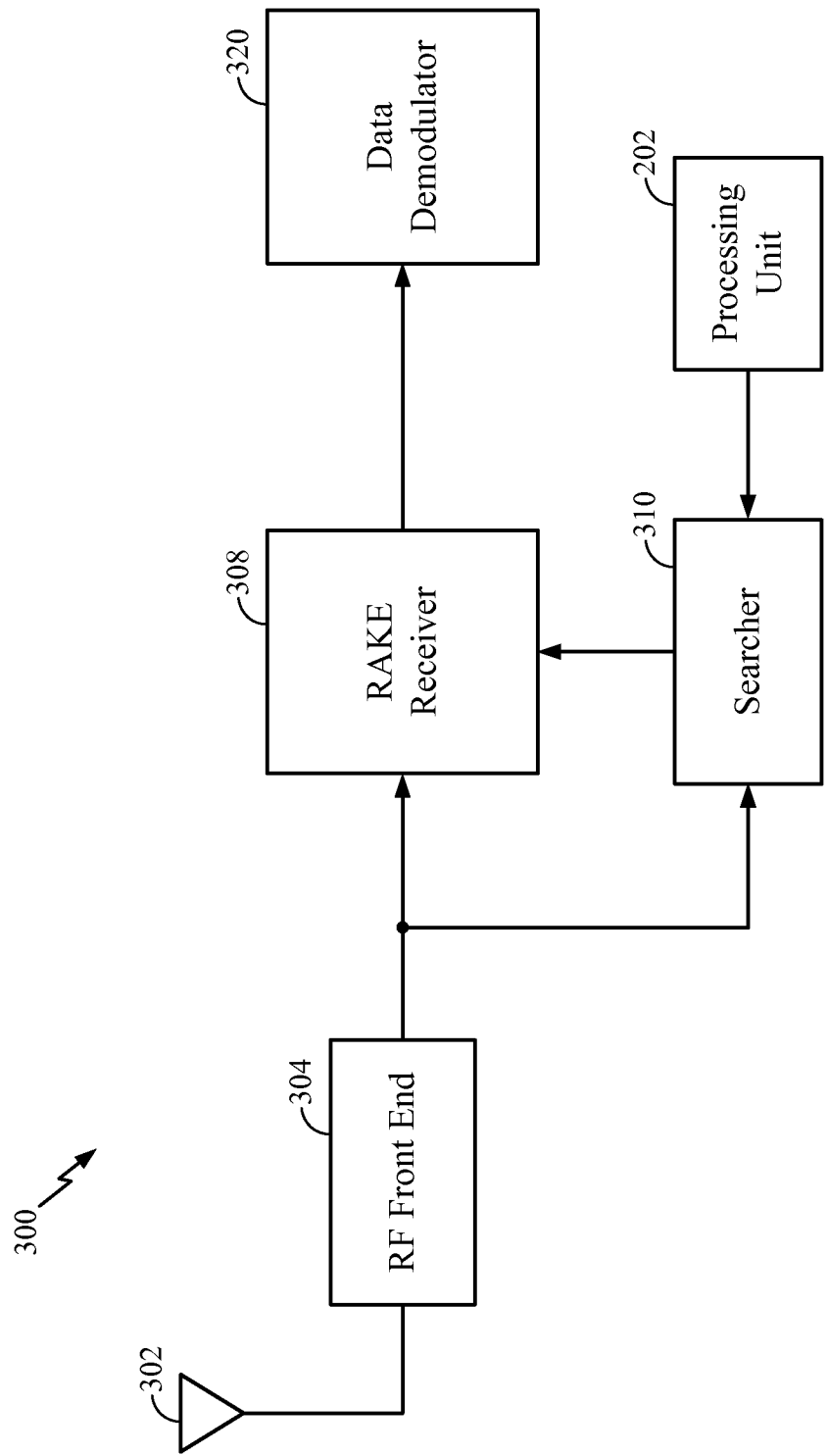
FIG. 3 is a functional block diagram of an exemplary mobile device having a searcher which uses stationarity information to reduce power consumption.

FIG. 3 is a functional block diagram of an exemplary receiver 300 having a searcher which may use stationarity information to reduce power consumption. The receiver 300 of the mobile device 106 may be part of the wireless network transceiver 206 described above in FIG. 2. The receiver 300 may include an antenna 302, an RF front end 304, a RAKE receiver 308, a searcher 310, and a data demodulator 320. In the description below, various components that may be commonly found in mobile receivers which may not contribute to the explanation of this embodiment have been omitted for ease of discussion.

The antenna 302 may receive wireless transmissions from one or more base stations, such as base station 108, and provide these transmissions in the form of electrical signals to RF front end 304. In many environments, the received wireless transmission may include an original line of sight transmission superimposed on a number of multipath components. Multipath components may be thought of as delayed copies of the original wave traveling through a different path, wherein each component may have a different magnitude and time-of-arrival at the receiver. Since each component contains the original information, if the magnitude and time-of-arrival of each component are determined, then all the multipath components may be combined to improve the quality of the received signal.

RF front end 304 receives electrical signals from antenna 302 within an RF frequency band. Upon reception, RF front end 304 may down convert these electrical signals from the RF frequency band to baseband. In addition, RF front end 304 may filter the electrical signals received from the antenna 302 in accordance with a predetermined bandwidth. RF front end 304 may also include amplification components (not shown) that increase the power of RF signals, such as pilot and traffic signals, received by antenna 302. Exemplary amplification components include a low noise amplifier (LNA) to initially amplify signals upon reception by antenna 302, and a variable gain amplifier (VGA) to amplify these signals after they are mixed down to an intermediate frequency (IF) during the down conversion process described above. One or more of these amplification components can have variable gains that may be controlled by an automatic gain control module (not shown). As a result of these functions, RF front end 304 produces a baseband signal which may be composed of in-phase (I) and quadrature (Q) signal components.

The baseband signal from the RF front end 304 may be provided to the RAKE receiver 308. The RAKE receiver can counter the effects of multipath fading by using several "sub-receivers" called fingers (not shown). Each finger may contain a separate correlator to perform despreading, and be assigned to a different multipath component by altering the delay of the reference PN sequence. Accordingly, each finger may independently despread a single multipath component. At a subsequent stage in processing, the contribution from each finger can be combined in the RAKE receiver 308 to efficiently utilize the different transmission characteristics of each transmission path. The combination of each finger can thus improve the signal quality in an environment having high multipath (e.g., an urban environment). After the RAKE receiver performs despreading to obtain symbol and combing, the symbol data may then be provided to data demodulator 320 to convert the symbols to bit data using known techniques.

The searcher 310 may be configured to search for the strongest of a plurality signals arriving from a plurality of base stations. The plurality of signals may include signals from different base stations in the wireless network 104 within range of the mobile device 106, and additional multipath components of these signals. The searcher may discriminate among the signals from the different base stations using known techniques, such as, for example, despreading with codes that are specific to each base station, or match filtering to find time offsets that are specific to each tower, or frequency hypothesis testing to find the frequencies associated with each base station, or any combination thereof. In the example shown in FIG. 3, the searcher may also assist the RAKE receiver in assigning fingers to multipath components in the RAKE receiver 308 for signal combining. However, it should be understood that the searcher may be used with other types of receivers.

When performing a full search for base stations, searcher 310 may utilize information provided by the processing unit 202. The processing unit 202 may provide a command to the searcher which reduces the frequency or simply prevents a periodic search from occurring when the mobile device 106 is stationary. This can reduce the rate of the search by 2× for every 10× reduction in probability of cell detection. For example, in a WCDMA system, performing a full search every 60 seconds, for every 10× increase in confidence that the mobile device is stationary.

The processor unit 202 may utilize the movement data 220 (e.g., the stationarity data, 226a and/or the velocity data 226b) and movement exploitation procedure 218 to determine if the mobile unit 106 is stationary. Details of this process are provided below in the description of FIG. 4.

Figure 4:
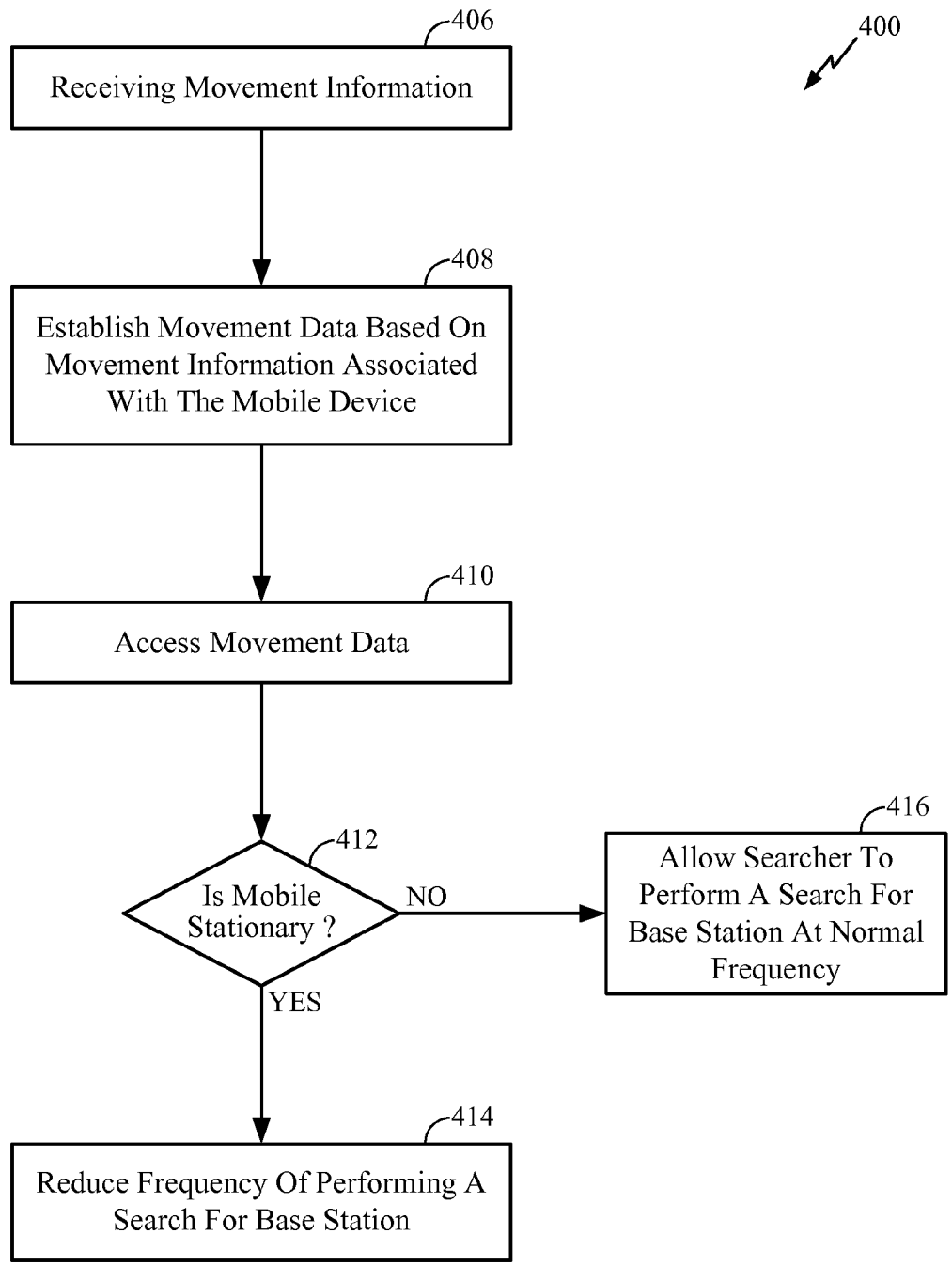
FIG. 4 is a flow diagram associated with the mobile device shown in FIG. 3.

FIG. 4 is a flow diagram illustrating a process 400 for use in the mobile device 106. Process 400 begins with generating movement information (406). The movement information may be associated with the sensed positional status of the mobile device 106. For example, the movement information may be generated by one or more movement sensors 212, such as, for example, an accelerometer, a gyroscope, a geo-magnetic sensor, an altimeter, or the like, within or otherwise coupled to the mobile device. For example, the movement information may be generated by one or more SPS receivers 214 within the mobile device based, at least in part, on received SPS signals.

In 408, movement data 220 is established based, at least in part, on the movement data 220 generated in 406. Here, movement information from the movement sensor 212 and/or SPS receiver 214 may be further processed by movement procedure 216 to further refine the movement data 220. In certain implementations, movement information may be provided from the movement sensor 212 and/or the SPS receiver 214 without further processing by the processing unit 202.

In one example, at least a portion of the movement information may be converted or otherwise processed, as applicable, and the resulting movement data 220 provided for storage in memory. Such movement data 220 may include, for example, stationarity data 226a, velocity data 226b, and/or directionality data 226c. Other data such as position, position uncertainty data, or the like, may also be generated. Moreover, various thresholds (e.g., stationarity, velocity, etc.) may be derived from the motion data 226, or directly received from the movement sensor 212 and/or the SPS receiver 214. In alternative implementations, such thresholds may be predetermined and provided by the manufacturer (during fabrication of the mobile device 106), and/or the network operator (via wireless network transceiver 206), and stored in memory 204, and/or they may be provided via input/output 208, and/or otherwise accessed and provided for storage in memory.

All or part of the actions in 406 and/or 408 may be repeated as needed or desired. For example, it may be desirable to update at least a portion of movement information and/or at least a portion of movement data to account for movement or lack thereof by the mobile device 106, or the passage of time.

In 410, at least a portion of movement data 220 established in 408 may be accessed. For example, the stationarity data 226a that may be stored in memory 204 may be accessed from memory by processor 202. The movement data may be further processed by movement and/or stationarity detection algorithms. The movement/stationarity detection algorithm may include pass filtering of the sensor data, processing of sensor data across multiple axes, such as derivation of Euclidian or Manhattan distance, the counting of events when thresholds are reached within some time window, etc. In 412, a determination may be made to ascertain whether the mobile device 106 is stationary based upon the accessed movement data 220.

In one implementation, the stationarity data 226a may simply be a logical value indicating a stationary/non-stationary state of the mobile device 106. Accordingly, a straightforward logical operation may be performed in 412 to determine mobile device 106 stationarity. In another implementation, the stationarity data 226a may be a numeric value indicating the probability of the mobile device 106 being in a stationary state, where the numeric value may be compared to a predetermined threshold to determine mobile device 106 stationarity. In another implementation, the velocity of the mobile device 106 may be utilized to determine if the mobile device is stationary through a comparison with a velocity threshold value.

In another example, determining whether the mobile device 106 is stationary may be accomplished by computing the position uncertainty of the mobile device, which may be provided directly by the movement sensor 212 and/or the SPS receiver, or this may be computed by the processing unit 202 using the movement data 220.

If it is determined in 412 that the mobile device 106 is stationary, then the frequency of searcher 310 performing a search may be reduced 414. In one example, the processing unit 202 may provide a signal or command word to the searcher 310 to reduce the search frequency. In another embodiment, the processing unit 202 may provide a signal not to perform a full search, but instead may initiate a partial search to, for example, conserve power. In another example, all of the subsystems in the mobile device 106 save the movement sensors 212 may be in a sleep mode for power conservation, and awaken if and only if there is movement. In another example, units involved in the search process may stay asleep and then be awakened when there is movement. In yet another example, presence of movement may accelerate the rate of searching to gain acquisition reliability. If it is determined that the mobile device is non-stationary, then the searcher 310 may be allowed to perform a search for a base station at a normal frequency 416. Such a frequency may be system dependent and based upon network standards.

In various implementations, blocks 410, 412, 414 and 416 may be performed in movement exploitation module 218.

Increasing Performance of Finger in RAKE Receiver

Figure 5:
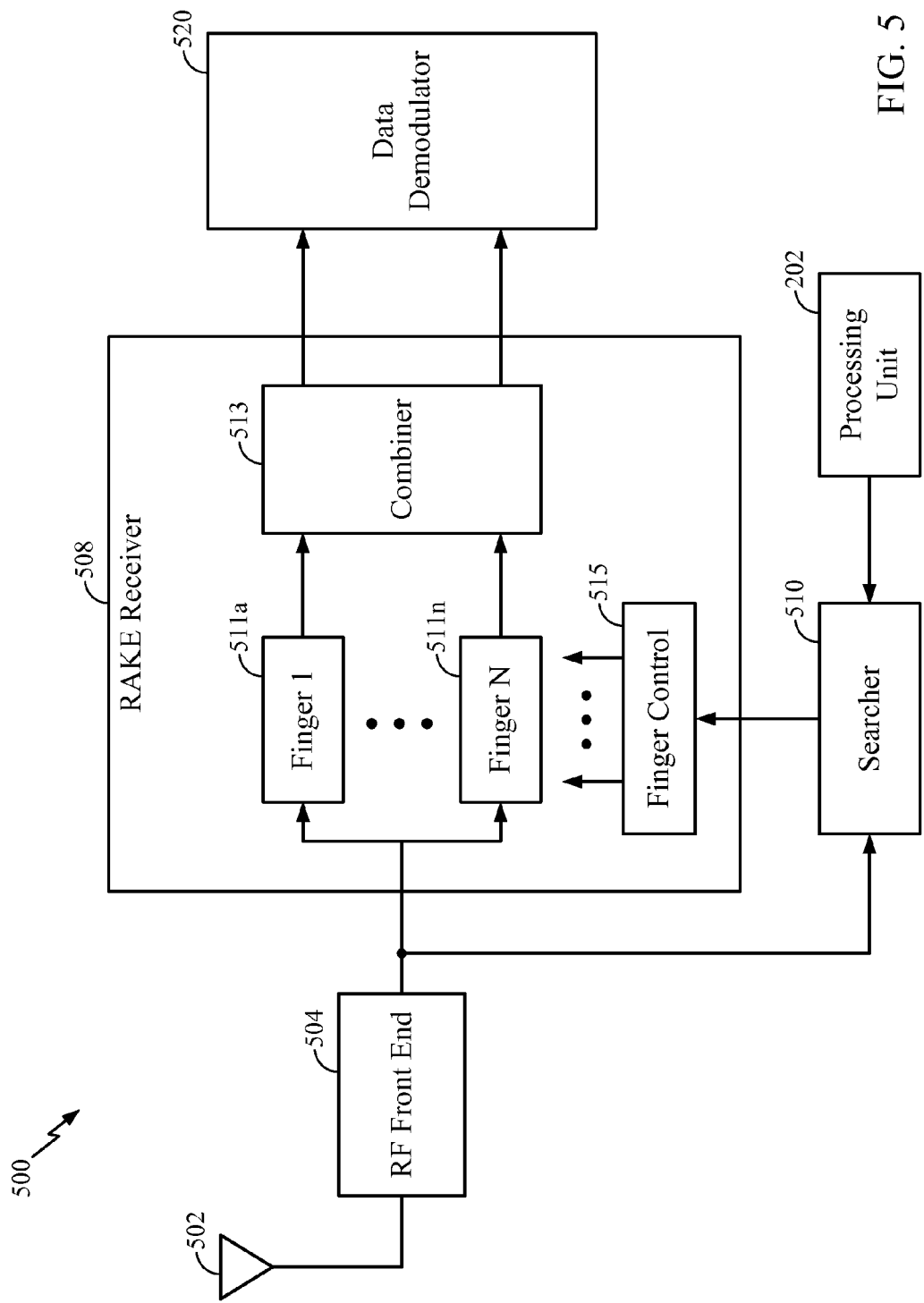
FIG. 5 is a functional block diagram of an exemplary mobile device having a finger controller which uses velocity information to improve performance.

FIG. 5 is a functional block diagram of a mobile device having a finger controller which uses velocity information to improve performance. In this embodiment, the path delays used by each finger in a RAKE receiver may be updated using velocity information of the mobile device 106. The velocity information can improve the finger updating procedure over the conventional updating process used in traditional RAKE receivers.

The receiver 500 may include an antenna 502, an RF front end 504, a RAKE receiver 508, a searcher 510 and a data demodulator 520. The antenna 502, RF front end 504 and data demodulator 520 may be similar in function and description to the antenna 302, RF front end 304 and data demodulator 320 shown in FIG. 3, respectively. For brevity, the explanation of similar components previously described will not be repeated. Also, in the description below, various components that may be commonly found in mobile receivers and do not contribute to the explanation of this embodiment have been omitted for ease of discussion.

The RAKE receiver 508 may further include a plurality of fingers (finger 1 511a through finger N 511n), a finger controller 515 and a combiner 513. During operation, the baseband signal from the RF front end 304 may be provided to the RAKE receiver 508. The RAKE receiver can counter the effects of multipath fading by using the plurality of fingers 511a through 511n in association with the combiner 513. Each finger may contain a separate correlator to perform despreading using separate PN sequences. The separate PN sequences may have differing time delays, each time delay may correspond to a different path the received signal traversed due to reflections (i.e., multipath components). The output of finger 511a through 511n may be coherently combined (i.e., appropriately integrating the (I, Q) samples from each finger while taking the time delays into account) to improve the signal-to-noise ratio of the received signal. The combined signal may be provided to the data demodulator 520 to map the received (I, Q) symbols into soft bits.

The searcher 510 may include conventional techniques for determining the time delays of the PN sequences. These may involve estimating and tracking the signal paths in the environment by maintaining track of a variety of signal parameters, including the path delay, signal strength, code, frequency, etc. In some environments, some signal parameters may change in an oscillating and/or a spurious manner, thus causing the searcher 510 to oscillate between paths when attempting to maintain a track. Updating in this manner may be referred to as "thrashing," which is undesirable because thrashing may waste system resources on the mobile device. To avoid thrashing in a conventional system, the limits may be placed on the searcher 510 regarding the number of updates which are made in order to maintain track of the signal paths.

In the embodiment shown in FIG. 5, information regarding the mobile device's movement can be used to improve the speed of the update process and prevent thrashing. Processing unit 202 may provide searcher 510 with the velocity of the mobile device to update the path searching algorithm. Specifically, the velocity information may be used to set the update rate of finger parameters in relation to instantaneous measurements of the signal environment. For example, a high speed user can have a higher finger update rate than stationary users as to track real time changes in the environment.

It should be appreciated that in other embodiments, the searcher 510 and controller 515 may be combined into a single module.

In summary, the processor unit 202 may utilize the movement data 220 (e.g., the stationarity data, 226a and/or the velocity data 226b) and movement exploitation procedure 218 to determine if the mobile unit 106 is stationary, and use such data to assist in searcher path tracking. Details of this process are provided below in the description of FIG. 6.

Figure 6:
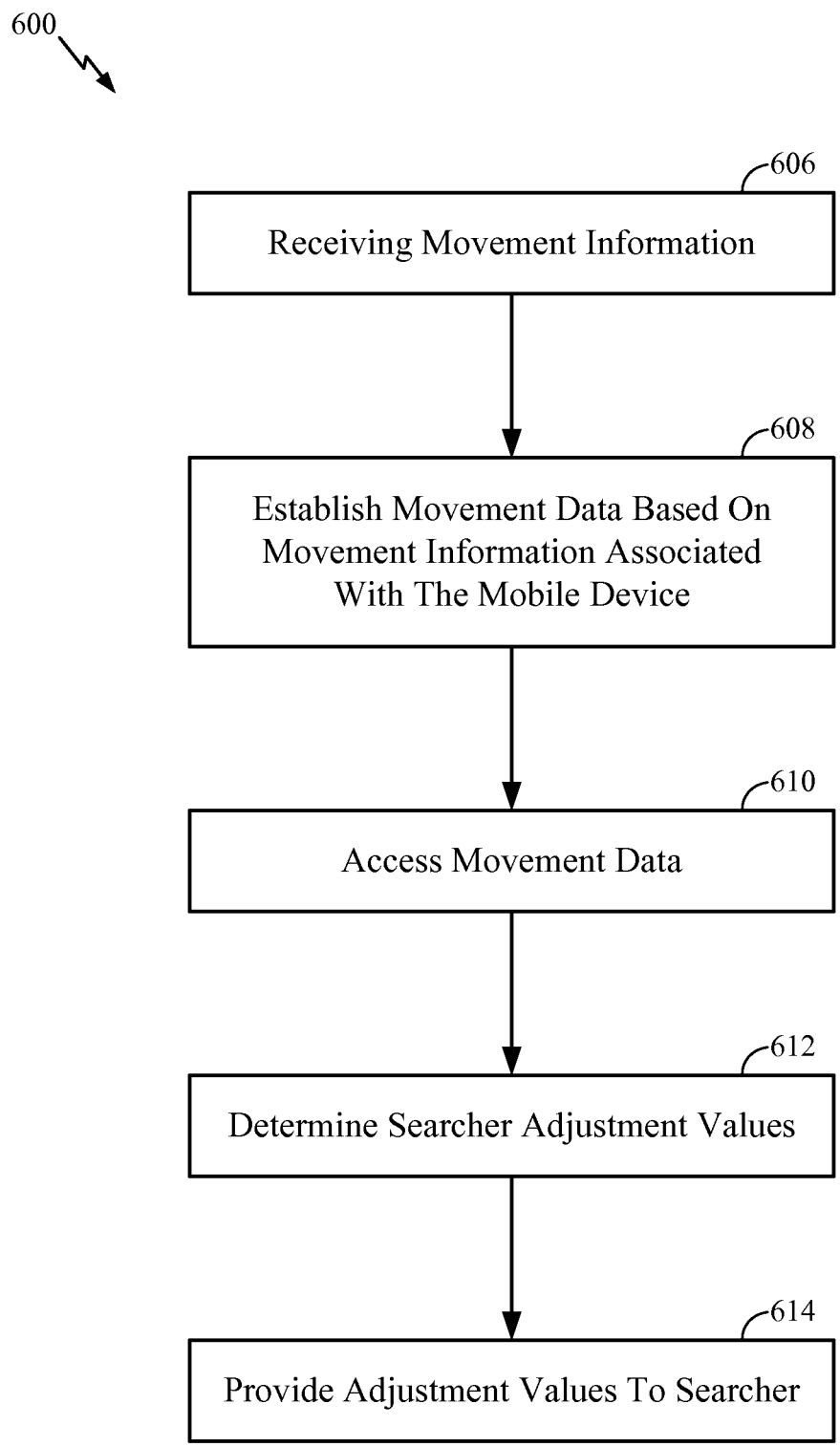
FIG. 6 is a flow diagram associated with the mobile device shown in FIG. 5.

FIG. 6 is a flow diagram illustrating a process 600 for use in the mobile device 106. Process 600 begins with generating movement information (606). The movement information may be associated with the sensed positional status of the mobile device 106. For example, the movement information may be generated by one or more movement sensors 212, such as, for example, an accelerometer, a gyroscope, a geo-magnetic sensor, an altimeter, or the like, within or otherwise coupled to the mobile device. For example, the movement information may be generated by one or more SPS receivers 214 within the mobile device based, at least in part, on received SPS signals.

In 608, movement data 220 is established based, at least in part, on the movement data 220 generated in 606. Here, movement information from the movement sensor 212 and/or SPS receiver 214 may be further processed by movement procedure 216 to further refine the movement data 220. In certain implementations, movement information may be provided from the movement sensor 212 and/or the SPS receiver 214 without further processing by the processing unit 202.

In one example, at least a portion of the movement information may be converted or otherwise processed, as applicable, and the resulting movement data 220 provided for storage in memory. Such movement data 220 may include, for example, stationarity data 226a, velocity data 226b, and/or directionality data 226c. Other data such as position, position uncertainty data, or the like, may also be generated. Moreover, various thresholds (e.g., stationarity, velocity, etc.) may be derived from the motion data 226, or directly received from the movement sensor 212 and/or the SPS receiver 214. In alternative implementations, such thresholds may be predetermined and provided by the manufacturer (during fabrication of the mobile device 106), and/or the network operator (via wireless network transceiver 206), and stored in memory 204, and/or they may be provided via input/output 208, and/or otherwise accessed and provided for storage in memory.

All or part of the actions in 606 and/or 608 may be repeated as needed or desired. For example, it may be desirable to update at least a portion of movement information and/or at least a portion of movement data to account for movement or lack thereof by the mobile device 106, or the passage of time.

In 610, at least a portion of movement data 220 established in 608 may be accessed. For example, the stationarity data 226a that may be stored in memory 204 may be accessed from memory by processor 202. The movement data may be further processed by movement and/or stationarity detection algorithms. In 612, the movement data 220 may be converted to adjustment values that can be utilized by the searcher 510 to track a path. Such adjustment values may be time offsets used for correlation operations, or filter coefficients used to maintain tracking. The time offsets and/or filter coefficients may be computed by the processing unit 202. For example, if movement velocity data 226b (i.e. speed and directionality with respect to the tower) is available, one can increase or shrink the time search window linearly based upon the velocity. In a CDMA200 system, for example, the relationship may be about 250 meters per chip, thus if the mobile device approaches the tower by 250 meter in approximately 15 seconds, the time search window can be shrunk by 1 chip. However, relationships with other towers may get more complex as time is relative to the serving tower, although upper bounds can be used with respect to speed. Once the searcher adjustment values are determined in 612, the processor unit 202 may apply these values to the searcher 510. In various implementations, blocks 410, 412, 414 and 416 may be performed in movement exploitation module 218.

Increasing Performance of AGC

Conventional Automatic Gain Controls (AGC) may be thought of as control systems that utilize parameters (e.g., time constants) that can be based upon the rate of change of the power in the input signal. However, the performance of the AGC may be improved if the responsiveness of the AGC varied based upon the velocity and/or position of the mobile device 106.

In various embodiments, the AGC may include an Infinite Impulse Response (IIR) filter having coefficients which may be adjusted based upon motion data. When the motion data indicates that the mobile device is stationary or moving slowly (e.g., 0-20 km/hr), historical data (i.e., prior data points) in the IIR filter may be emphasized (i.e., weighted more heavily). When the motion data indicates that the mobile device may be moving quickly (over 20 km/hr, e.g., around 120 km/hr), historical data in the IIR filter may be not be emphasized as much as in the slow case (i.e., weighted less heavily). The IIR filter is described more fully below.

Figure 7:
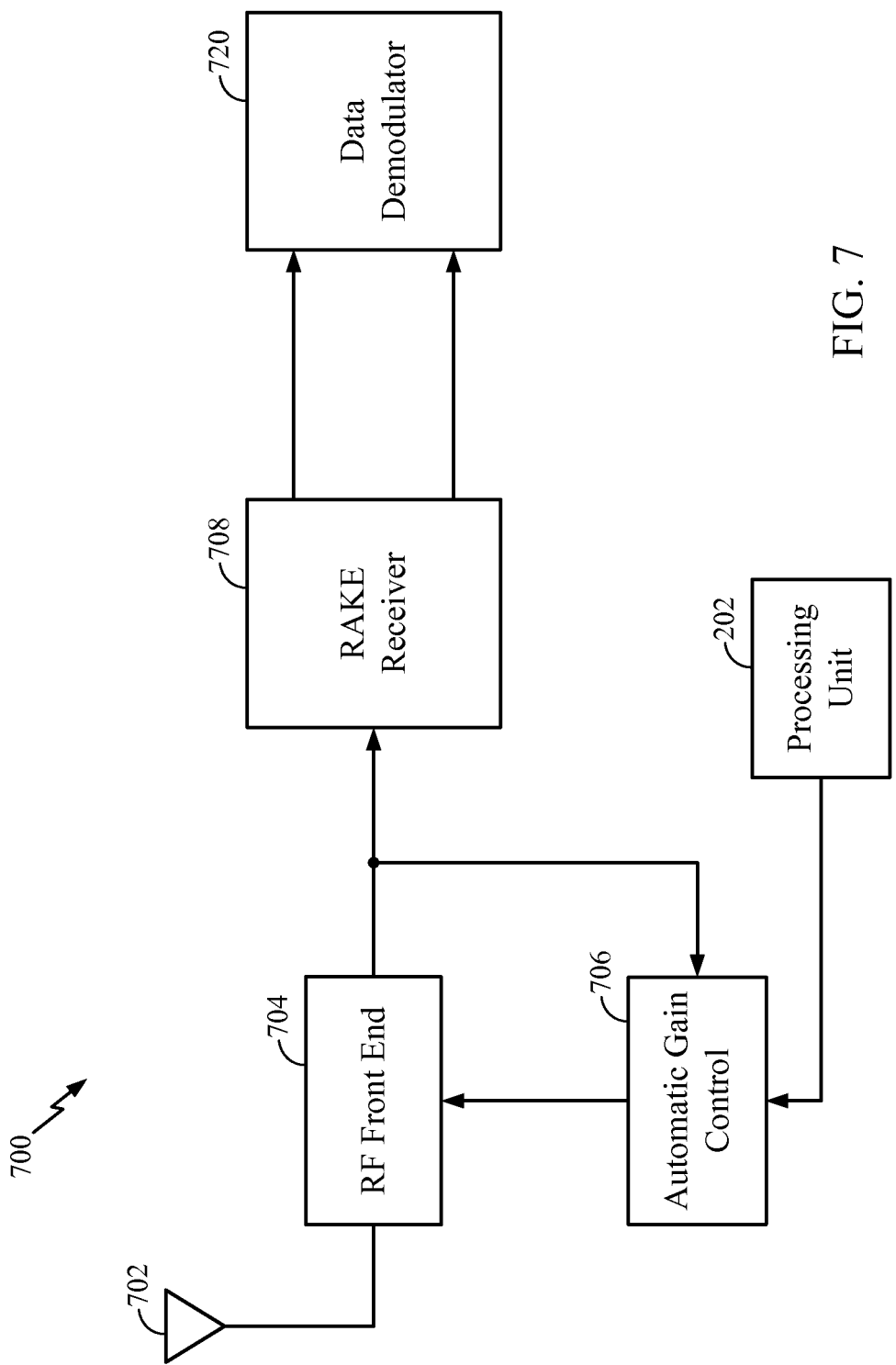
FIG. 7 is a functional block diagram of an exemplary mobile device having an Automatic Gain Control which uses motion information to improve performance.

FIG. 7 is a functional block diagram of an exemplary receiver 700 having an AGC 706 which may use velocity information to improve performance. The receiver 700 of the mobile device may be part of the wireless network transceiver 206 described earlier.

The receiver 700 may include an antenna 702, an RF front end 704, an Automatic Gain Control (AGC) 706, a RAKE receiver 708 and a data demodulator 720. The antenna 702, RF front end 704, RAKE receiver 708 and data demodulator 720 may be similar in function and description to the antenna 302, RF front end 304, RAKE receiver 308 and data demodulator 320 shown in FIG. 3, respectively. It should be appreciated that receiver 700 is not restricted to utilizing a RAKE receiver for performing the despreading operation. For brevity, the explanation of similar components previously described will not be repeated. Also, in the description below, various components that may be commonly found in mobile receivers which may not contribute to the explanation of this embodiment have been omitted for ease of discussion.

The AGC module 706 may adjust the gain of amplification components within RF front end 704 (not shown). These adjustments can maintain the received signal at a substantially constant power level, which may improve the signal to noise level while preventing oversaturation of the A/D converter in the RF front end 704. The AGC module 706 may perform these adjustments in response to feedback received from the signal provided by the output of RF front end 704. This feedback may be used to measure the energy of the signal output by the RF front end 704. These adjustments may involve sending a gain control signal to RF front end 704. The gain control signal may include a plurality of component signals, where each of these component signals corresponds to a particular amplification component within RF front end 304. These control signals may be analog or digital, and convey a gain setting for the corresponding amplification component.

The processing unit 202 may provide control signals to the AGC 706 which include control signals that are based on the velocity and/or position of the mobile device 106. The processing unit may command the AGC 706 to alter filter parameters which can dictate how fast the AGC responds to changes in input signal power. For example, during high mobility scenarios, the AGC 706 may be configured to respond more quickly to input variations. In another example, based upon the relative geometry between the base station and the mobile, the responsiveness of the AGC 706 may be altered by processing unit 202. As with the RAKE receiver 708, AGC designs may have time constants that allow information to be maintained in order so that they may respond to changes in the environment. The time constants can be adapted based on knowledge of user speed so that information can be updated more quickly when users are moving, and slow down in stationary scenarios. This can optimize performance and/or save on computational resources and/or power.

Figure 8:
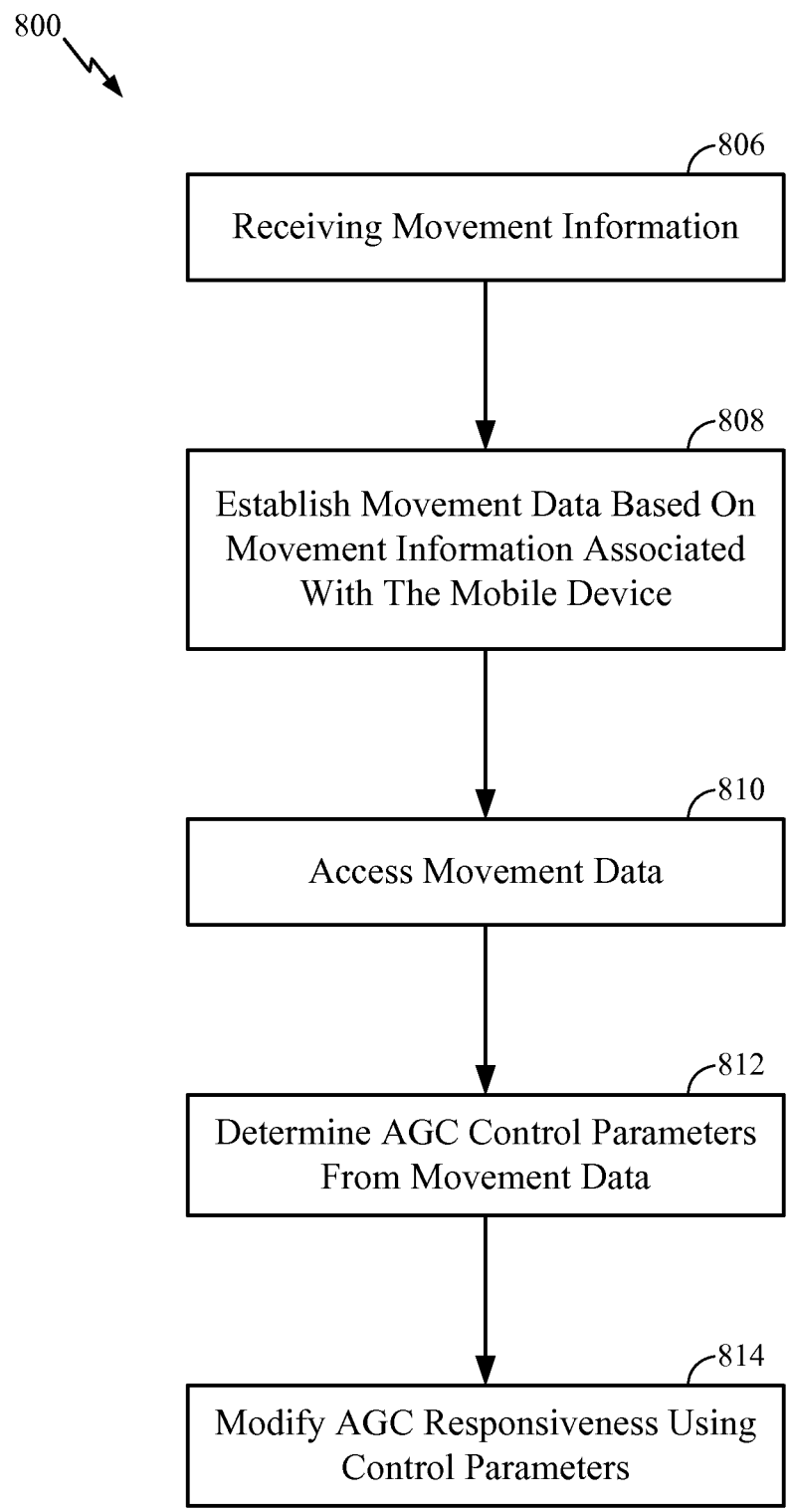
FIG. 8 is a flow diagram associated with the mobile device shown in FIG. 7.

FIG. 8 is an exemplary flow diagram 800 associated with the receiver 700 shown in FIG. 7. Process 800 begins with generating movement information (806). The movement information may be associated with the sensed positional status of the mobile device 106. For example, the movement information may be generated by one or more movement sensors 212, such as, for example, an accelerometer, a gyroscope, a geomagnetic sensor, an altimeter, or the like, within or otherwise coupled to the mobile device. For example, the movement information may be generated by one or more SPS receivers 214 within the mobile device based, at least in part, on received SPS signals.

In 808, movement data 220 is established based, at least in part, on the movement data 220 generated in 806. Here, movement information from the movement sensor 212 and/or SPS receiver 214 may be further processed by movement procedure 216 to further refine the movement data 220. In certain implementations, movement information may be provided from the movement sensor 212 and/or the SPS receiver 214 without further processing by the processing unit 202.

In one example, at least a portion of the movement information may be converted or otherwise processed, as applicable, and the resulting movement data 220 provided for storage in memory. Such movement data 220 may include, for example, stationarity data 226a, velocity data 226b, and/or directionality data 226c. Other data such as position, position uncertainty data, or the like, may also be generated. Moreover, various thresholds (e.g., stationarity, velocity, position, etc.) may be derived from the motion data 226, or directly received from the movement sensor 212 and/or the SPS receiver 214. In alternative implementations, such thresholds may be predetermined and provided by the manufacturer (during fabrication of the mobile device 106), and/or the network operator (via wireless network transceiver 206), and stored in memory 204, and/or they may be provided via input/output 208, and/or otherwise accessed and provided for storage in memory.

All or part of the actions in 806 and/or 808 may be repeated as needed or desired. For example, it may be desirable to update at least a portion of movement information and/or at least a portion of movement data to account for movement or lack thereof by the mobile device 106, or the passage of time.

In 810, at least a portion of movement data 220 established in 808 may be accessed. For example, the velocity data 226b that is stored in memory 204 may be accessed from memory by processor 202. In 812, processor 202 may determine AGC control parameters from the movement data. Such parameters may include new coefficients for IIR filters used in one or more control loops in AGC 706. The IIR filter coefficients may be include signal parameter estimators, including, for example, signal strength estimators, such as RSSI. An IIR filter used to estimate RSSI can be expressed with the following equation:

$$RSSI = alpha * RSSI\_old + (1 - alpha) * RSSI\_instant,$$

where RSSI_instant is an instantaneous estimate of signal strength.

Knowledge of user movement can be used to set the alpha value, e.g. a high value if user is stationary, which tends to weight RSSI_old more. Alternatively, alpha may be set to a low value which can correspond to when the mobile device 106 is moving, thus tending to weight RSSI_instant more.

In one implementation, the processing unit 202 may directly provide filter coefficients to the AGC 706. In another implementation, the processing unit may provide control signals instruction the AGC to exchange pre-stored coefficients for another pre-stored set which appropriately change the reaction time of AGC 706. In another example, altering the filer coefficients in AGC 706 may be based upon computing the position of the mobile device relative to the base station.

The control parameters determined in 812 may then be provided to the AGC 706 to alter its responsiveness (814). In various implementations, blocks 810, 812 and 814 may be performed in movement exploitation module 218.

Increasing Performance of Pilot Filter

Communication systems can use adaptive and/or static filters for pilot signal estimation. Adaptive pilot filters have a filter state and parameters that may change with the channel conditions. Such filters may exhibit better performance when the mobile device undergoes fast motion. Static filters are generally less complex and more efficient, and can produce better results under stationary conditions. Static filtering can be realized exclusively in "static" blocks such as hardware, while adaptive filtering may require "intelligent" logic (such as the running in a DSP processor) for realization.

Designs that leverage both types of filters may be beneficial in terms of overall performance and power consumption, while incurring some cost penalty for having to support both types of filters.

In designs that include adaptive filters, sensor motion readings can be used to adapt the filter parameters to user motion and the changing channel state. For example, Kalman filtering is one technique used to estimate the signal, through prediction from earlier received measurements and a derived state and model of the system. In a changing Doppler environment, the system parameters will be time varying resulting in a time-varying Kalman filter. In existing designs, user speed and the channel conditions may be inferred indirectly from affected parameters such the signal envelope and its attributes. For example, the higher the user motion, the higher the assumed spread in the signal envelope. Consequently, conventional speed estimation in existing designs can be inaccurate, and depending on implementation, processing intensive and power consuming.

In contrast, an embodiment presented herein may leverage motion sensors so that speed can be determined directly to derive appropriate filter parameters. Using speed information can lead to faster response time, improved accuracy of pilot filtering, reduced processing requirements and reduced power consumption. In another embodiment, both static and dynamic pilot filters may be used. Here, sensor motion readings can trigger switching between static and adaptive pilot filtering modules for optimal power consumption and performance.

Figure 9:
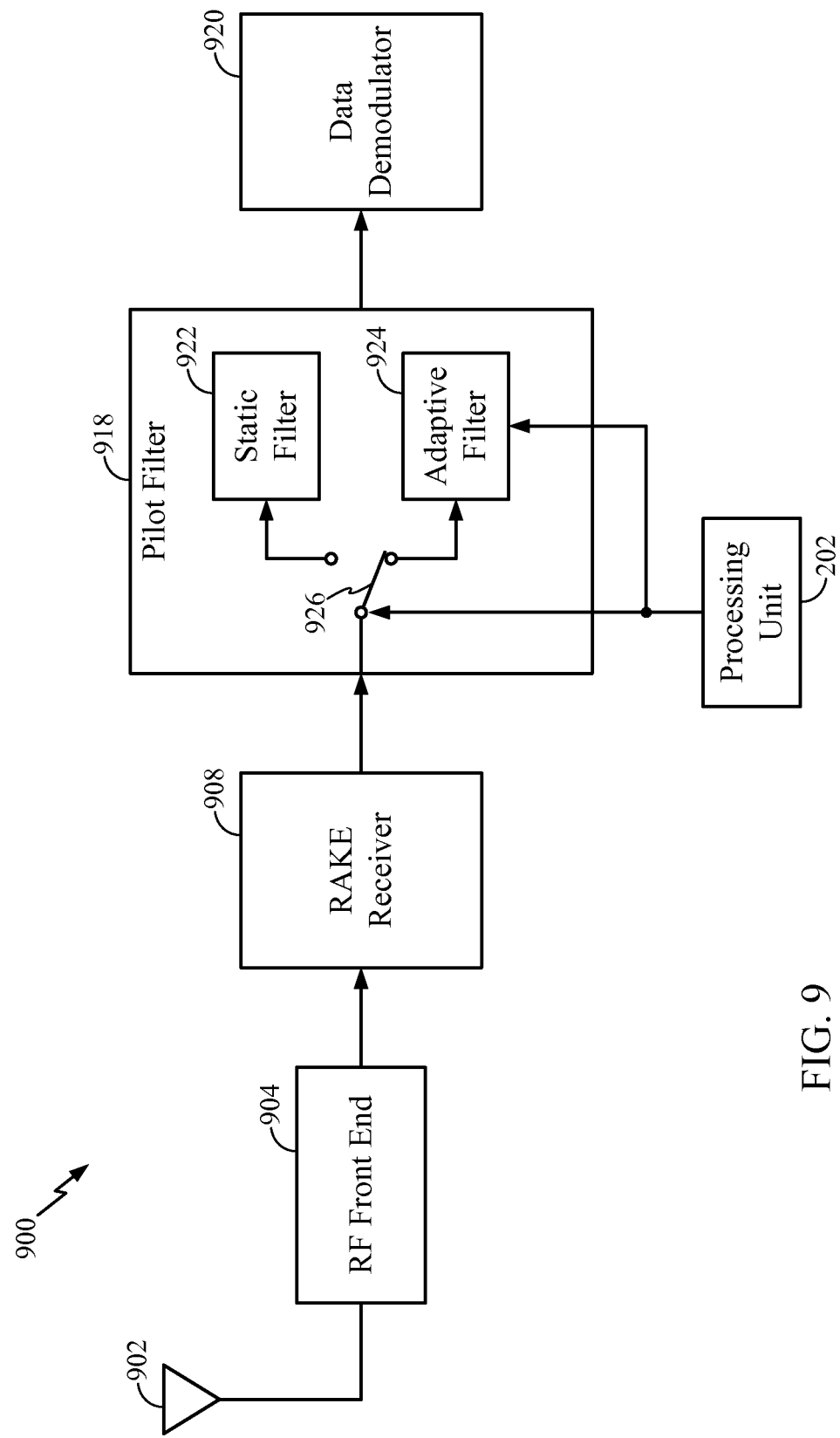
FIG. 9 is a functional block diagram of an exemplary mobile device having a pilot filter which uses velocity information to improve performance.

FIG. 9 shows a functional block diagram of a receiver 900 having a pilot filter which may use velocity information to improve performance.

The receiver may include an antenna 902, an RF front end 904, a receiver 908, a pilot filter 918, and a data demodulator 920. Those components in FIG. 9 having common names with those presented in FIG. 3 may share similar functionality and operation. For brevity, the explanation of similar components previously described will not be repeated. Also, in the description below, various components that may be commonly found in mobile receivers and do not contribute to the explanation of this embodiment have been omitted for ease of discussion. It should be appreciated the embodiment shown in FIG. 9 is not restricted to using a RAKE receiver, and any other known receiver type may be used for performing the despreading operation.

The embodiment shown in FIG. 9 depicts a pilot filter 918 that can switch between static and adaptive filters based on velocity information (hereinafter referred to as a "switched pilot filter"), and an adaptive filter having parameters that vary according to measured speed information (hereinafter referred to as "motion varying adaptive filter"). It should be appreciated that other embodiments need not include both types of filters, and may only include either a switched pilot filter or a speed varying adaptive filter.

The pilot filter may receive a despread symbols from RAKE receiver 908 to recover the pilot signal(s) embedded therein. The pilot signal(s) may be provided by base stations as reference signal(s), and provide time and phase references to assist in the demodulation of the received symbols. Once the pilot signal(s) are extracted, they may be provided to the data demodulator 920 to assist in the demodulation of symbols into data bits.

Pilot filter 918 may include a switch 926 static filter 922, and an adaptive filter 924. The combination of these elements may from the switched pilot filter. The switch may be controlled by processing unit 202, which can provided a signal to switch between static filter 922 ad adaptive filter 924 depending upon the movement data 220. The movement data 220 used may be velocity data 226*b*, which can be reduced to speed by processor 202 for controlling the switch. Depending upon the value of the speed, the received signal from RAKE receiver may be provided to either the static filter 922 or the Adaptive filter 924. For example, when the speed of the mobile device is 50 km/hr or lower, the switch will provide the signal to the static filter 922 to extract the pilot signal. For speeds higher than 50 km/hr, the pilot signal may be extracted by adaptive filter 924.

Additionally, adaptive filter 924 may be a motion varying adaptive filter which can utilize motion data 220 to alter filter parameters. In some embodiments, processing unit 202 may compute filter parameters from movement data 220, and provide these parameters to the adaptive filter 924. Such filter parameters may include filter coefficients, gain and bandwidth, and may be computed from the motion data using known techniques. For example, the filter bandwidth can be adapted to f=f_carrier*v/c, f_carrier is the carrier frequency of the received signal, where v is the user velocity, and c is the speed of light.

Figure 10:
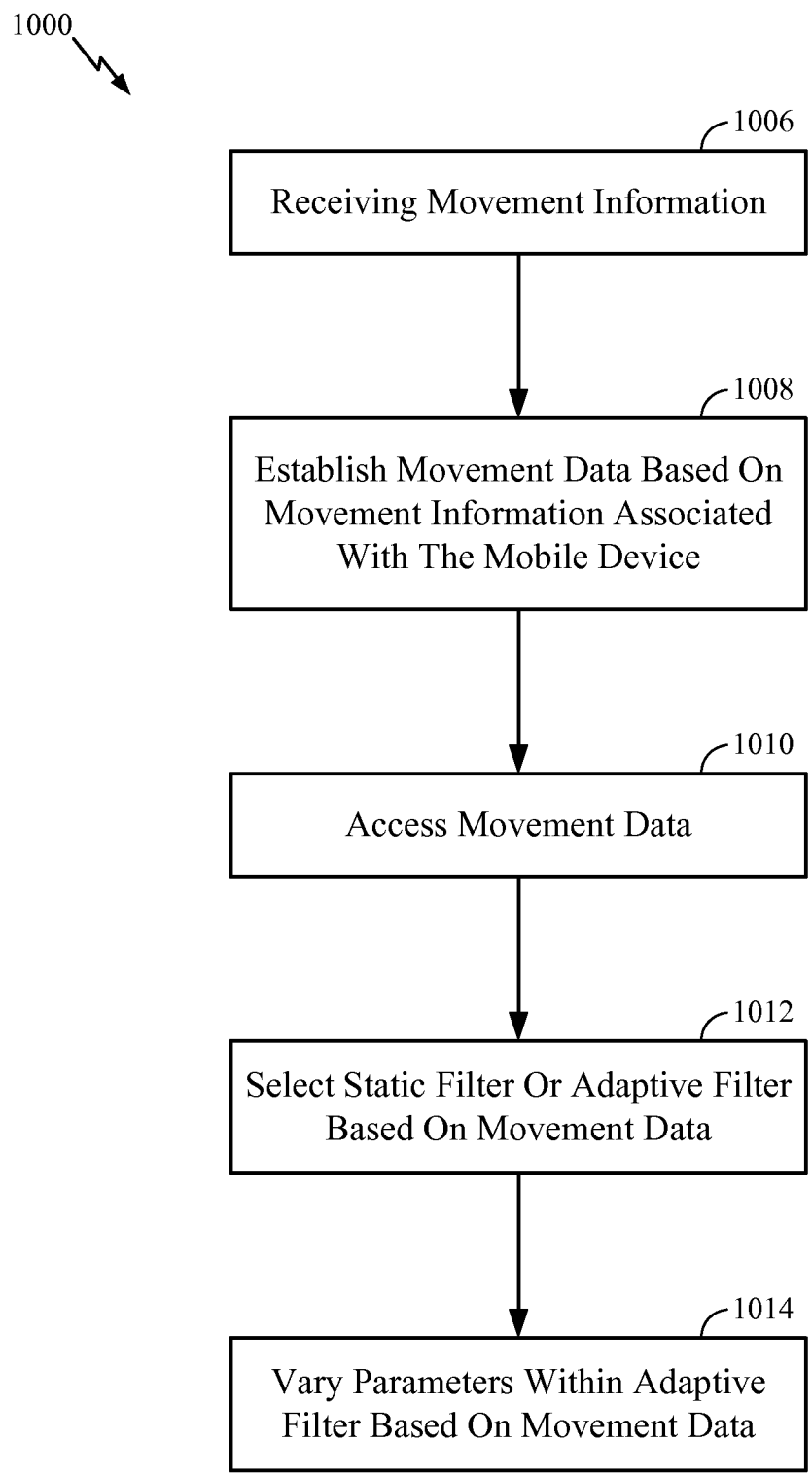
FIG. 10 is a flow diagram associated with the mobile device shown in FIG. 9.

FIG. 10 is a flow diagram illustrating a process 1000 which may be used in the receiver shown in FIG. 9. Process 1000 begins with generating movement information (1006). The movement information may be associated with the sensed positional status of the mobile device 106. For example, the movement information may be generated by one or more movement sensors 212, such as, for example, an accelerometer, a gyroscope, a geomagnetic sensor, an altimeter, or the like, within or otherwise coupled to the mobile device. For example, the movement information may be generated by one or more SPS receivers 214 within the mobile device based, at least in part, on received SPS signals.

In 1008, movement data 220 is established based, at least in part, on the movement data 220 generated in 1006. Here, movement information from the movement sensor 212 and/or SPS receiver 214 may be further processed by movement procedure 216 to further refine the movement data 220. In certain implementations, movement information may be provided from the movement sensor 212 and/or the SPS receiver 214 without further processing by the processing unit 202.

In one example, at least a portion of the movement information may be converted or otherwise processed, as applicable, and the resulting movement data 220 provided for storage in memory. Such movement data 220 may include, for example, stationarity data 226*a*, velocity data 226*b*, and/or directionality data 226*c*. Other data such as position, position uncertainty data, or the like, may also be generated. Moreover, various thresholds (e.g., stationarity, velocity, etc.) may be derived from the motion data 226, or directly received from the movement sensor 212 and/or the SPS receiver 214. In alternative implementations, such thresholds may be predetermined and provided by the manufacturer (during fabrication of the mobile device 106), and/or the network operator (via wireless network transceiver 206), and stored in memory 204, and/or they may be provided via input/output 208, and/or otherwise accessed and provided for storage in memory.

All or part of the actions in 1006 and/or 1008 may be repeated as needed or desired. For example, it may be desirable to update at least a portion of movement information and/or at least a portion of movement data to account for movement or lack thereof by the mobile device 106, or the passage of time.

In 1010, at least a portion of movement data 220 established in 1008 may be accessed. For example, the velocity data 220b that may be stored in memory 204 may be accessed from memory by processor 202. The movement data may be further processed by movement and/or stationarity detection algorithms.

In 1012, the movement data 220 may used to determine which type of filer to select based upon the motion data, and a command may be issued by the processor 202 to switch 926 for placing the desired pilot filter in the signal path. When the mobile device is stationary or moving at a slow speed, the switch 926 may provide the received signal to the static filter to extract the pilot signal. When the mobile device is above a threshold speed, a command may be sent to switch 926 so that the adaptive filter 924 is used to isolate the pilot signal from the received symbols.

In 1014, adaptive filter parameters may be computed by the processor 202 and passed to the adaptive filter 924. The parameters can be used to vary the characteristics of adaptive filter 924 based on speed of the mobile device.

In other embodiments, blocks 1012 and 1014 may not both be performed. For example, if pilot filter 918 does not use an adaptive filter which uses parameters derived from velocity, then only block 1012 may be performed. Alternatively, if static filter 922 is no utilized, only block 1014 may be performed so alter the characteristics of adaptive filter 924 based on velocity.

Increasing Performance of an Equalizer

During communications between the mobile device 106 and base station 108, transmitted signals may become distorted as they travel through the communication channel. Additionally, the signals may also experience degradation from noise and interference encountered during transmission. A channel equalizer can attempt to correct for such degradations and generate an estimate of the transmitted symbol. Conventional equalizers used in mobile devices can handle time-varying channel conditions; however, their ability to adapt to channel changes resulting from the mobility of the mobile device could be improved. Such an improvement may be realized by incorporating the velocity information of the mobile device 106 into the adaptive procedures used by the channel equalizer to compensate for changing channel conditions.

In various embodiments, the AGC may include an Infinite Impulse Response (IIR) filter having coefficients which may be adjusted based upon motion data. When the motion data indicates that the mobile device is stationary or moving slowly (e.g., 0-20 km/hr), historical data (i.e., prior data points) in the IIR filter may be emphasized (i.e., weighted more heavily). When the motion data indicates that the mobile device may be moving quickly (over 20 km/hr, e.g., 120 m/s), historical data in the IIR filter may be not be emphasized as much as in the slow case (i.e., weighted less heavily). The IIR filter is described more fully below.

Figure 11:
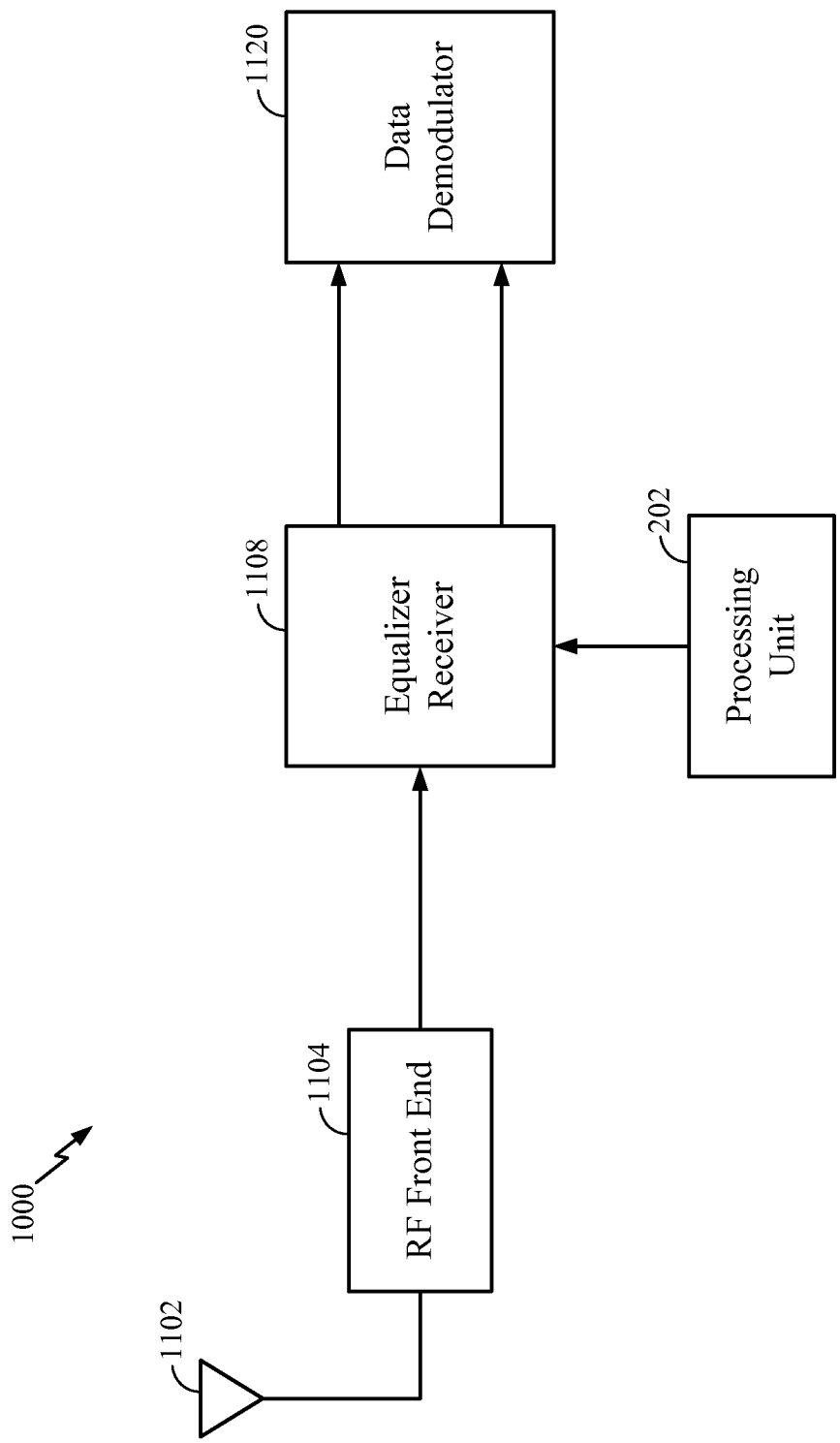
FIG. 11 is a functional block diagram of an exemplary mobile device having a receiver using an equalizer that uses velocity information to improve performance.

FIG. 11 is a functional block diagram of a mobile device having a receiver 1100 using an equalizer that uses velocity information to improve performance. The receiver 1100 may include an antenna 1102, an RF front end 1104, an equalizer receiver 1108 and a data demodulator 1120. The antenna 1102, RF front end 1104 and data demodulator 1120 may be similar in function and description to the antenna 302, RF front end 304 and data demodulator 320 shown in FIG. 3, respectively. For brevity, the explanation of similar components previously described will not be repeated. Also, in the description below, various components that may be commonly found in mobile receivers which may not contribute to the explanation of this embodiment have been omitted for ease of discussion.

Equalizer receiver 1108 may estimate the conditions of the communications channel as they vary, and invert the channel distortions using an adaptive filter. Once channel distortions have been mitigated, the equalizer receiver 1108 may then estimate symbols from the equalized signal, and then provide the symbols to data demodulator 1120 for demodulation into a bit sequence.

The equalizer in the equalizer receiver 1108 may be implemented with a transversal filter, i.e. a delay line with T-second taps (where T is the symbol duration). The contents of the taps may be amplified and summed to generate an estimate of the transmitted symbol. The tap coefficients are adjusted to reduce interference from symbols that are adjacent in time to the desired symbols. Commonly, an adaptive equalization technique is employed whereby the tap coefficients are continually and automatically adjusted. The adaptive equalizer may use a prescribed algorithm, such as, for example, Least Mean Squares (LMS) or Recursive Least Squares (RLS), to determine the tap coefficients. Alternatively, any suitable optimization algorithm may be used, such as, for example, Minimum Mean Square Error (MMSE) combining.

The adaptive filtering algorithm used to modify the equalizer tap coefficients may utilize the velocity information for the mobile device in conjunction with the input(s) that are conventionally used. For example, knowledge of the user state may be used to initiate or slow down the process of channel estimation depending upon which filter parameters are derived.

The processing unit 202 may provide control signals to the equalizer receiver 1108 which include control signals that are based on the velocity of the mobile device 106. The processing unit may command the equalizer receiver 1108 to alter filter parameters which can dictate how fast the equalizer receiver 1108 responds to changing channel conditions. For example, during high mobility scenarios, the equalizer receiver 1108 may be configured to respond more quickly to input variations.

Figure 12:
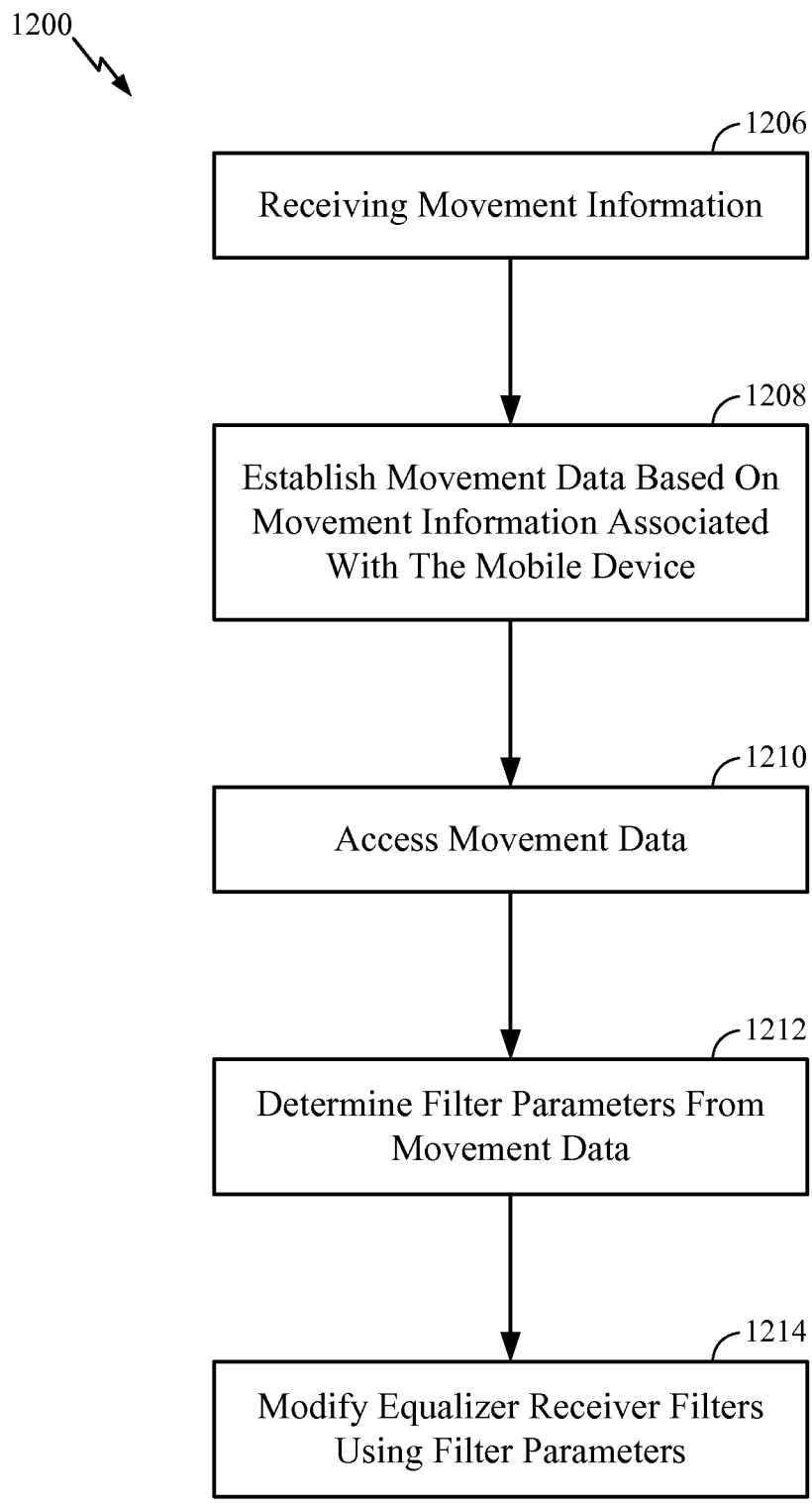
FIG. 12 is a flow diagram associated with the mobile device shown in FIG. 11.

FIG. 12 is an exemplary flow diagram 1200 associated with the receiver 1100 shown in FIG. 11. Process 1200 begins with generating movement information (1206). The movement information may be associated with the sensed positional status of the mobile device 106. For example, the movement information may be generated by one or more movement sensors 212, such as, for example, an accelerometer, a gyroscope, a geomagnetic sensor, an altimeter, or the like, within or otherwise coupled to the mobile device. For example, the movement information may be generated by one or more SPS receivers 214 within the mobile device based, at least in part, on received SPS signals.

In 1208, movement data 220 is established based, at least in part, on the movement information generated in 1206. Here, movement information from the movement sensor 212 and/or SPS receiver 214 may be further processed by movement procedure 216 to further refine the movement data 220. In certain implementations, movement information may be provided from the movement sensor 212 and/or the SPS receiver 214 without further processing by the processing unit 202.

In one example, at least a portion of the movement information may be converted or otherwise processed, as applicable, and the resulting movement data 220 provided for storage in memory. Such movement data 220 may include, for example, velocity data 226b. Other data such as position, position uncertainty data, or the like, may also be generated. Moreover, various thresholds (e.g., stationarity, velocity, position, etc.) may be derived from the motion data 226, or directly received from the movement sensor 212 and/or the SPS receiver 214. In alternative implementations, such thresholds may be predetermined and provided by the manufacturer (during fabrication of the mobile device 106), and/or the network operator (via wireless network transceiver 206), and stored in memory 204, and/or they may be provided via input/output 208, and/or otherwise accessed and provided for storage in memory.

All or part of the actions in 1206 and/or 1208 may be repeated as needed or desired. For example, it may be desirable to update at least a portion of movement information and/or at least a portion of movement data to account for movement or lack thereof by the mobile device 106, or the passage of time.

In 1210, at least a portion of movement data 220 established in 1208 may be accessed. For example, the velocity data 226b that is stored in memory 204 may be accessed from memory by processor 202. In 1212, processor 202 may determine the equalizer control parameters from the movement data 220. Such parameters may include new coefficients for IIR filters used in equalizer receiver 1108. As described above, IIR filters may be associated with signal parameter estimators, including signal strength estimators, RSSI. An IIR filter used to estimate RSSI can be expressed with the following equation:

$$RSSI = alpha * RSSI\_old + (1-alpha) * RSSI\_instant,$$
where $RSSI\_instant$ is an instantaneous estimate of signal strength.

In one implementation, the processing unit 202 may directly provide filter coefficients to the equalizer receiver 1108. In another implementation, the processing unit may provide control signals instruction the equalizer receiver 1108 to exchange pre-stored coefficients for another pre-stored set which appropriately change the channel estimation.

The control parameters determined in 1212 may then be provided to the equalizer receiver 1108 to alter its channel estimation (1214). In various implementations, blocks 1210, 1212 and 1214 may be performed in movement exploitation module 218.

Selection Between Equalizer vs. RAKE

The RAKE receiver and Equalizer can be thought of as competing signal filtering modules that are optimal under different scenarios. Motion sensor information can be used to identify the mobility scenario of the mobile device, and select the signal filtering module that is most appropriate. For example, in low mobility scenarios, the Equalizer can be used to filter the signal. In high mobility scenarios, the Rake module can be employed.

Figure 13:
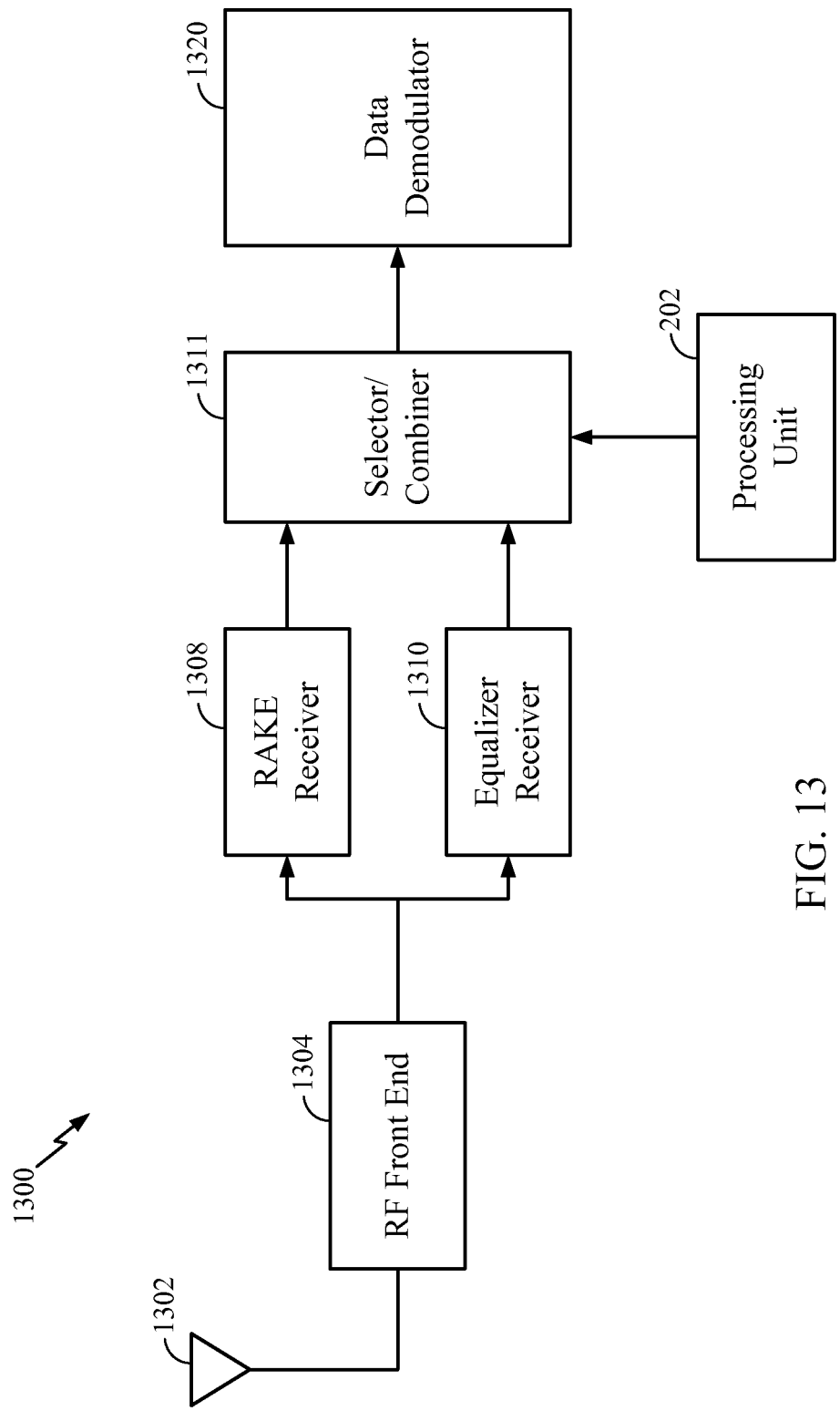
FIG. 13 is a functional block diagram of an exemplary mobile device having a receiver which selects between an Equalizer and a RAKE processing based upon velocity information.

FIG. 13 shows a functional block diagram of a receiver 1300 having a selectable receiver which may change receiver modules based upon the motion of the mobile device.

The receiver 1300 may include an antenna 1302, an RF front end 1304, a RAKE receiver 1308, an equalizer receiver 1310, a selector/combiner 1318, and a data demodulator 1320. Those components in FIG. 13 having common names with those presented in FIG. 3 may share similar functionality and operation. For brevity, the explanation of similar components previously described may not be repeated. Also, in the description below, various components that may be commonly found in mobile receivers and do not contribute to the explanation of this embodiment have been omitted for ease of discussion.

The received signals from the RF front end 1304 may be provided to both the RAKE receiver 1308 and the equalizer receiver 1310. Each receiver may process the and despread the signal using conventional approaches associated with RAKE and equalizer receivers. Afterwards, the output from each receiver may be provided to a selector/combiner 1311. The selector/combiner 1311 may, based upon a control signal from the processing unit 202, select the signal from the RAKE receiver 1308 or the equalizer receiver 1310. One control signal from the processing unit 202 may based upon the movement data 220. For example, from the movement data, the speed of the mobile device 106 may be determined. If the speed is at or below a certain threshold, for example 50 km/hr, then the control signal will direct the selector/combiner 1311 to select the signal from the Equalizer receiver 1310 to be forwarded to the data demodulator 1320. If the speed of the mobile unit is above the threshold, then the control signal may direct the selector/combiner 1311 to direct the signal from the RAKE receiver to the data demodulator 1320. The thresholds may be determined by empirical performance studies.

Alternatively, instead of merely selecting between the RAKE receiver 1308 and the equalizer receiver 1310, the selector/combiner may combine the two signals from each receiver based upon a control signal provided by the processing unit 202. In one embodiment the combination may be weighted based upon motion data, wherein the weighting can reflect the relative quality of each receiver's output based upon the motion of the mobile device.

While the combiner is shown as a separate module in FIG. 13, other embodiments may utilize a combiner typically found in a conventional RAKE receiver to combine the signals of the RAKE receiver and the equalizer receiver 1310. Common utilization of the combiner in the RAKE receiver may save both die space on the integrated circuit and power consumption.

In another embodiment (not shown) the signal from the RF front end 1304 may be provided directly to a switch controlled by processing unit 202. Through the switch, the processing unit may provide the received signal to either the RAKE receiver 1308 or the equalizer receiver 1310, depending upon the motion of the mobile device. The processing unit may, for example, provide a control signal to the switch based upon speed thresholds as described above.

Figure 14:
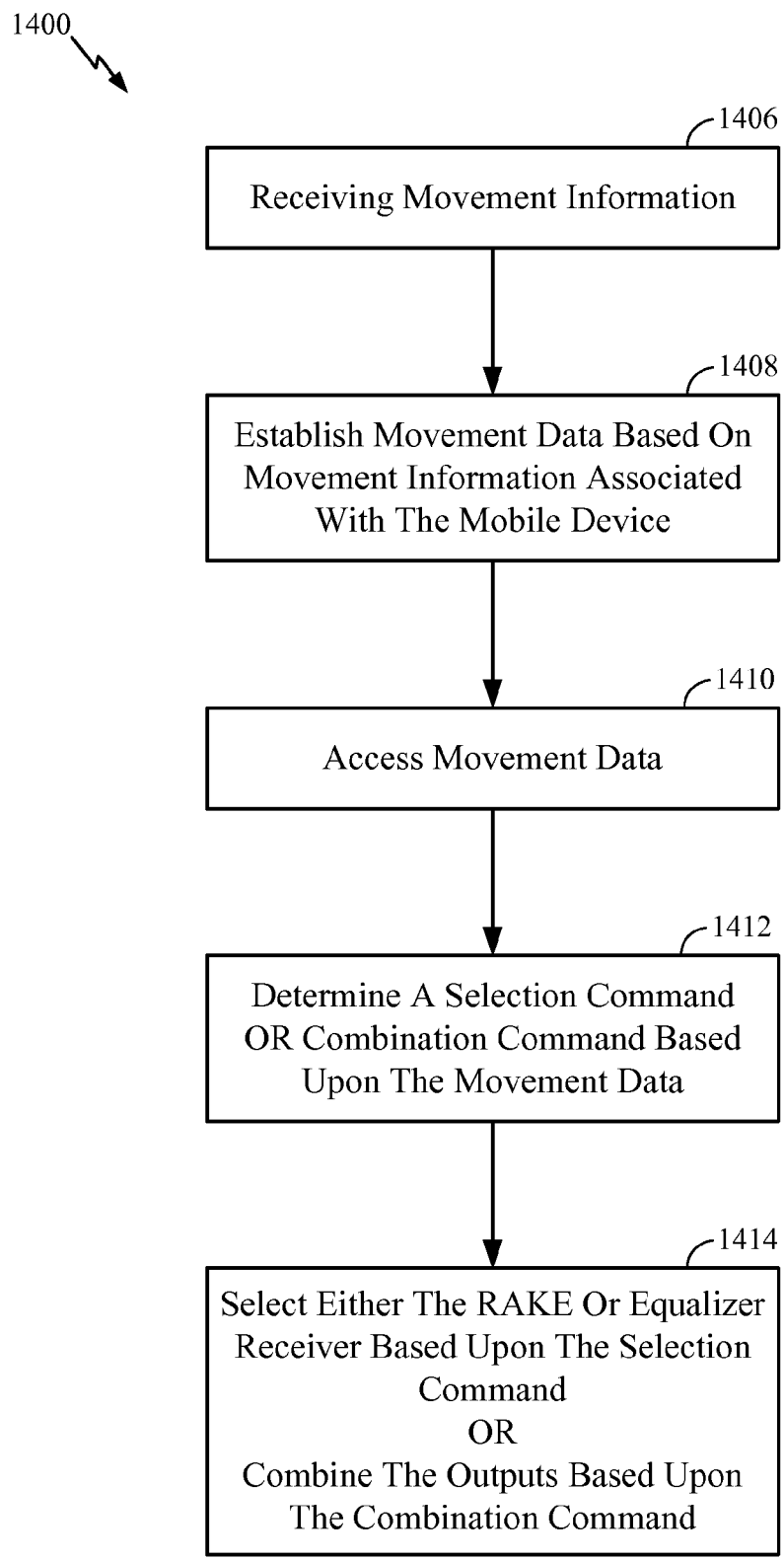
FIG. 14 is a flow diagram associated with the mobile device shown in FIG. 13.

FIG. 14 is a flow diagram illustrating a process 1400 which may be used in the receiver shown in FIG. 13. Process 1400 begins with receiving movement information (1406). The movement information may be associated with the sensed positional status of the mobile device 106. For example, the movement information may be generated by one or more movement sensors 212, such as, for example, an accelerometer, a gyroscope, a geomagnetic sensor, an altimeter, or the like, within or otherwise coupled to the mobile device. For example, the movement information may be generated by one or more SPS receivers 214 within the mobile device based, at least in part, on received SPS signals.

In 1008, movement data 220 is established based, at least in part, on the movement data 220 generated in 1406. Here, movement information from the movement sensor 212 and/or SPS receiver 214 may be further processed by movement procedure 216 to further refine the movement data 220. In certain implementations, movement information may be provided from the movement sensor 212 and/or the SPS receiver 214 without further processing by the processing unit 202.

In one example, at least a portion of the movement information may be converted or otherwise processed, as applicable, and the resulting movement data 220 provided for storage in memory. Such movement data 220 may include, for example, stationarity data 226a, velocity data 226b, and/or directionality data 226c. Other data such as position, position uncertainty data, or the like, may also be generated. Moreover, various thresholds (e.g., stationarity, velocity, etc.) may be derived from the motion data 226, or directly received from the movement sensor 212 and/or the SPS receiver 214. In alternative implementations, such thresholds may be predetermined and provided by the manufacturer (during fabrication of the mobile device 106), and/or the network operator (via wireless network transceiver 206), and stored in memory 204, and/or they may be provided via input/output 208, and/or otherwise accessed and provided for storage in memory.

All or part of the actions in 1406 and/or 1408 may be repeated as needed or desired. For example, it may be desirable to update at least a portion of movement information and/or at least a portion of movement data to account for movement or lack thereof by the mobile device 106, or the passage of time.

In 1410, at least a portion of movement data 220 established in 1408 may be accessed. For example, the velocity data 220b that may be stored in memory 204 may be accessed from memory by processor 202. The movement data may be further processed by movement and/or stationarity detection algorithms.

In 1412, the movement data 220 may be converted to commands by the processor 202 that can be utilized by selector/combiner 1311. The command may be a signal instructing the selector/combiner to switch to the equalizer receiver 1310 during low mobility scenarios, and switch to the RAKE receiver 1308 during high mobility scenarios. Alternatively, the command may be to instruct the selector/combiner 1311 to combine the outputs of the RAKE and equalizer receivers. Such commands may be determined using known models, lookup tables and/or empirical techniques. The form of the combination may vary depending on the mobility scenario. For example, during low mobility, the equalizer receiver 1310 may be weighted more heavily, and during high mobility scenarios, the RAKE receiver 1308 may be more heavily weighted. In 1414, the processor 202 may issue the appropriate commands to the selector/combiner 1311 so the appropriate output of the receiver(s) is sent to the data demodulator 1320.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for sensor uses in communication systems. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for reducing power consumption in a mobile device, comprising:
   receiving movement information;
   establishing movement data based on uncertainty of the movement information, wherein the movement information is received from a movement sensor and/or a Satellite Position System (SPS) receiver;
   determining a probability that the mobile device is stationary using the movement data;
   combining the movement information from the movement sensor and the SPS receiver to refine the movement data;
   determining that the mobile device is stationary when the determined probability is greater than a threshold probability; and
   reducing a frequency of searching for a signal source when the mobile device is stationary, wherein the signal source comprises a base station and/or an SPS satellite.

2. The method according to claim 1, further comprising:
   allowing the mobile device to search for a base station when it is determined that the mobile device is not stationary.

3. The method of claim 1, wherein the movement data comprises stationarity data, velocity data, and/or directionality data.

4. The method according to claim 1, wherein the uncertainty of the movement information is received directly from the SPS receiver and/or directly from the movement sensor.

5. A mobile device which reduces power consumption based upon movement data, comprising:
   an RF front end;
   a receiver coupled to the RF front end;

a data demodulator coupled to the receiver;
a searcher, coupled to the RF front end and the receiver, which searches for a signal source;
a processing unit coupled to the searcher; and
a Satellite Positioning System (SPS) receiver and/or a movement sensor coupled to the processing unit; and
a memory, coupled to the processing unit, which comprises instructions causing the processor to:
receive movement information,
establish movement data based on uncertainty of the movement information, wherein the uncertainty of the movement information is received directly from the SPS receiver and/or directly from the movement sensor,
combine movement information from the SPS receiver and the movement sensor to refine the movement data,
determine a probability that the mobile device is stationary using the movement data, determine that the mobile device is stationary when the determined probability is greater than a threshold probability, and
reduce a frequency of searching for a signal source when the mobile device is stationary, wherein the signal source comprises a base station and/or an SPS satellite.

6. The mobile device according to claim 5, wherein the processor will accelerate the rate of searching in the presence of movement of the mobile device.

7. A method for reducing power consumption in a mobile device, comprising:
receiving movement information;
establishing movement data based on uncertainty of the movement information, wherein the movement information is received from a movement sensor and/or a Satellite Position System (SPS) receiver;
determining a probability that the mobile device is stationary using the movement data;
combining the movement information from the movement sensor and the SPS receiver to refine the movement data;
determining that the mobile device is stationary when the determined probability is greater than a threshold probability; and
reducing a frequency of searching for a signal source when the mobile device is stationary, wherein the searching comprises performing a partial search, and wherein the signal source comprises a base station and/or an SPS satellite.

8. A mobile device which reduces power consumption based upon movement data, comprising:
an RF front end;
a receiver coupled to the RF front end;
a data demodulator coupled to the receiver;
a searcher, coupled to the RF front end and the receiver, which searches for a signal source;
a processing unit coupled to the searcher; and
a Satellite Positioning System (SPS) receiver and/or a movement sensor coupled to the processing unit; and
a memory, coupled to the processing unit, which comprises instructions causing the processor to:
receive movement information,
establish movement data based on uncertainty of the movement information, wherein the uncertainty of the movement information is received directly from the SPS receiver and/or directly from the movement sensor,
combine movement information from the SPS receiver and the movement sensor to refine the movement data,
determine a probability that the mobile device is stationary using the movement data,
determine that the mobile device is stationary when the determined probability is greater than a threshold probability, and
reduce a frequency of searching for a signal source when the mobile device is stationary, wherein a partial search is performed when the mobile device is stationary, and wherein the signal source comprises a base station and/or an SPS satellite.

* * * * *